United States Patent
Inoue et al.

(10) Patent No.: US 10,038,134 B2
(45) Date of Patent: Jul. 31, 2018

(54) ELECTROACOUSTIC TRANSDUCTION FILM AND MANUFACTURING METHOD OF ELECTROACOUSTIC TRANSDUCTION FILM

(71) Applicant: FUJIFILM Corporation, Tokyo (JP)

(72) Inventors: Daisuke Inoue, Ashigara-kami-gun (JP); Tetsu Miyoshi, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/663,058

(22) Filed: Jul. 28, 2017

(65) Prior Publication Data

US 2017/0331030 A1    Nov. 16, 2017

Related U.S. Application Data

(63) Continuation of application No. PCT/JP2016/052204, filed on Jan. 26, 2016.

(30) Foreign Application Priority Data

Jan. 29, 2015  (JP) .................................. 2015-015518

(51) Int. Cl.
*H01L 41/18* (2006.01)
*H04R 17/00* (2006.01)
(Continued)

(52) U.S. Cl.
CPC .......... *H01L 41/183* (2013.01); *H01L 41/257* (2013.01); *H01L 41/37* (2013.01);
(Continued)

(58) Field of Classification Search
CPC ..... H01L 41/183; H01L 41/04; H04R 31/003; H04R 17/005
(Continued)

(56) References Cited

U.S. PATENT DOCUMENTS

| 2014/0210309 A1 | 7/2014 | Miyoshi | |
|---|---|---|---|
| 2014/0296716 A1* | 10/2014 | Kiyose | A61B 8/4427 600/459 |
| 2016/0008852 A1* | 1/2016 | Miyoshi | H04R 17/005 359/444 |

FOREIGN PATENT DOCUMENTS

| JP | 61-195314 A | 8/1986 |
|---|---|---|
| JP | 63-15599 A | 1/1988 |

(Continued)

OTHER PUBLICATIONS

International Preliminary Report on Patentability and English translation of the Written Opinion of the International Searching Authority (Forms PCT/IB/338, PCT/IB/373 and PCT/ISA/237) dated Aug. 10, 2017, for International Application No. PCT/JP2016/052204.

(Continued)

*Primary Examiner* — Derek Rosenau
(74) *Attorney, Agent, or Firm* — Birch, Stewart, Kolasch & Birch, LLP

(57) ABSTRACT

Provided are an electroacoustic transduction film in which conversion between a vibration and a voltage is able to be appropriately performed without the occurrence of dielectric breakdown of the air between upper and lower thin film electrodes even when a high voltage is applied therebetween, a user is able to be prevented from coming into contact with a piezoelectric layer, and high productivity is achieved, and a manufacturing method of an electroacoustic transduction film. A piezoelectric layer which stretches and contracts in response to a state of an electric field, an upper thin film electrode formed on one principal surface of the piezoelectric layer, a lower thin film electrode formed on the other principal surface of the piezoelectric layer, an upper protective layer formed on the upper thin film electrode, and a lower protective layer formed on the lower thin film electrode are included, and a groove which penetrates the (Continued)

thin film electrode and the protective layer is formed in at least a portion of an outer peripheral portion in a surface direction of at least one of the upper thin film electrode and the upper protective layer, or the lower thin film electrode and the lower protective layer.

20 Claims, 12 Drawing Sheets

(51) Int. Cl.
*H04R 31/00* (2006.01)
*H04R 7/04* (2006.01)
*H01L 41/257* (2013.01)
*H01L 41/37* (2013.01)

(52) U.S. Cl.
CPC .............. *H04R 7/04* (2013.01); *H04R 17/005* (2013.01); *H04R 31/003* (2013.01); *H04R 2217/01* (2013.01); *H04R 2499/11* (2013.01)

(58) Field of Classification Search
USPC .................................................. 310/322, 334
See application file for complete search history.

(56) References Cited

FOREIGN PATENT DOCUMENTS

| JP | 7-322392 A | 12/1995 |
|---|---|---|
| JP | 2000-338901 A | 12/2000 |
| JP | 2008-294493 A | 12/2008 |
| JP | 2014-14063 A | 1/2014 |
| WO | 2013/042658 A1 | 3/2013 |
| WO | 2013/047872 A1 | 4/2013 |

OTHER PUBLICATIONS

International Search Report (PCT/ISA/210) issued in PCT/JP2016/052204, dated Apr. 26, 2016.
Written Opinion of the International Searching Authority (PCT/ISA/237) issued in PCT/JP2016/052204, dated Apr. 26, 2016.

\* cited by examiner

ELECTROACOUSTIC TRANSDUCTION FILM AND MANUFACTURING METHOD OF ELECTROACOUSTIC TRANSDUCTION FILM

CROSS-REFERENCE TO RELATED APPLICATIONS

This application is a Continuation of PCT International Application No. PCT/JP2016/052204 filed on Jan. 26, 2016, which claims priority under 35 U.S.C. § 119(a) to Japanese Patent Application No. 2015-015518 filed on Jan. 29, 2015. The above application is hereby expressly incorporated by reference, in its entirety, into the present application.

BACKGROUND OF THE INVENTION

1. Field of the Invention

The present invention relates to an electroacoustic transduction film used for an acoustic device such as a speaker or a microphone, and a manufacturing method thereof.

2. Description of the Related Art

In response to thinning of displays such as liquid crystal displays and organic electroluminescence (EL) displays, speakers used for such thin displays are also required to be lighter and thinner.

In addition, a flexible display using a flexible substrate of plastic or the like has been studied. As a substrate of such a flexible display, for example, a flexible display substrate in which a gas barrier layer and a transparent conductive layer are laminated on a transparent plastic film is disclosed in JP2000-338901A.

The flexible display has superiority in lightweight properties, thinness, flexibility, and the like compared to a display of the related art using a glass substrate, and thus is able to be provided on a curved surface of a cylinder or the like. In addition, the flexible display is able to be contained by being rolled up, and thus does not impair portability even in the form of a large screen. Furthermore, the flexible display has been attracting attention as a display for displaying advertisement, or as a display device such as a personal digital assistant (PDA).

In a case where such a flexible display is used as an image display device-cum-sound generating device which concurrently reproduces an image and a sound as with a television receiver or the like, a speaker which is an acoustic device for generating a sound is necessary.

Here, as the shape of a speaker of the related art, a so-called cone shape such as a funnel-like shape, a spherical dome-like shape, and the like are generally used. However, when such a speaker is embedded in the flexible display described above, there is concern that lightweight properties and flexibility which are the advantages of the flexible display may be impaired. In addition, in a case where the speaker is attached to the outside of the flexible display, it is difficult to carry the flexible display and to dispose the flexible display on a curved wall, and thus there is concern that the aesthetic properties of the flexible display may also be impaired.

Among them, as a speaker which is thin and is able to be integrated with a thin display or a flexible display without impairing the lightweight properties or flexibility, it has been proposed to use a piezoelectric film which has flexibility in the form of a sheet and has a property that stretches and contracts in response to an applied voltage.

For example, in JP2008-294493A, it is described that a piezoelectric film (electroacoustic transduction film) in which electrodes forming a pair are laminated on both surfaces of a piezoelectric film (piezoelectric layer) obtained by performing polarization processing with respect to a monoaxially stretched film of polyvinylidene fluoride (PVDF) at a high voltage is used.

In order to adopt the piezoelectric film as a speaker, it is necessary that a stretching and contracting movement along a film surface is converted into a vibration of the film surface. This conversion from the stretching and contracting movement into the vibration is attained by holding the piezoelectric film in a bent state, and thus the piezoelectric film is able to function as a speaker.

In addition, the applicant proposed an electroacoustic transduction film disclosed in JP2014-14063A as a piezoelectric film which has flexibility in the form of a sheet and is able to stably reproduce a sound with high acoustic quality. The electroacoustic transduction film disclosed in JP2014-14063A includes: a polymer composite piezoelectric body (piezoelectric layer) in which piezoelectric body particles are dispersed in a viscoelastic matrix formed of a polymer material having viscoelasticity at a normal temperature; thin film electrodes formed on both surfaces of the polymer composite piezoelectric body; and protective layers formed on the surfaces of the thin film electrodes.

SUMMARY OF THE INVENTION

In the electroacoustic transduction film in which the thin film electrodes are formed on both surfaces of the piezoelectric layer, the piezoelectric layer is very thin and the distance between the upper and lower thin film electrodes is short. Therefore, it could be seen that when a high voltage is applied between the thin film electrodes, in the end portions thereof, dielectric breakdown of the air occurs between the upper and lower thin film electrodes, and there are problems that the voltage is not applied to the piezoelectric layer and a sound is not reproduced.

In addition, in JP2014-14063A, the electroacoustic transduction film configured to use the upper thin film electrode which is further smaller than the piezoelectric layer is described. As described above, by causing the size of the thin film electrode to be smaller than the piezoelectric layer, the distance between the upper and lower thin film electrode is able to be increased, and it is possible to prevent the occurrence of dielectric breakdown. However, in a state in which the piezoelectric layer is exposed, there is concern that the strength of the outer peripheral portion may decrease. In addition, there may be a case where the material of the piezoelectric layer is harmful to the human body. In JP2014-14063A, it is described that the end portions of the thin film electrodes and the piezoelectric layer are covered with side surface insulating layers in order to prevent a user from coming into contact with the thin film electrodes. However, this configuration requires a step of attaching an insulating sheet to the end portion and thus there is a problem that the manufacturing efficiency decreases.

An object of the present invention is to solve such a problem of the related art, and is to provide an electroacoustic transduction film in which thin film electrodes are formed on both surfaces of a piezoelectric layer, conversion between a vibration and a voltage is able to be appropriately performed without the occurrence of dielectric breakdown of the air between the upper and lower thin film electrodes even when a high voltage is applied therebetween, a user is able to be prevented from coming into contact with the piezoelectric layer, and high productivity is achieved, and a manufacturing method of an electroacoustic transduction film.

In order to attain the object, the present inventors found that by providing a piezoelectric layer which stretches and contracts in response to a state of an electric field, an upper thin film electrode formed on one principal surface of the piezoelectric layer, a lower thin film electrode formed on the other principal surface of the piezoelectric layer, an upper protective layer formed on the upper thin film electrode, and a lower protective layer formed on the lower thin film electrode, and forming a groove which penetrates the thin film electrode and the protective layer is formed in at least a portion of an outer peripheral portion in a surface direction of at least one of the upper thin film electrode and the upper protective layer, or the lower thin film electrode and the lower protective layer, a sound is able to be appropriately generated without the occurrence of dielectric breakdown of the air between the upper and lower thin film electrodes even when a high voltage is applied therebetween, a user is able to be prevented from coming into contact with the piezoelectric layer, and high productivity is achieved, and completed the present invention.

That is, the present invention provides an electroacoustic transduction film having the following configuration and a manufacturing method of an electroacoustic transduction film.

(1) An electroacoustic transduction film, comprising: a piezoelectric layer which stretches and contracts in response to a state of an electric field; an upper thin film electrode formed on one principal surface of the piezoelectric layer; a lower thin film electrode formed on the other principal surface of the piezoelectric layer; an upper protective layer formed on the upper thin film electrode; and a lower protective layer formed on the lower thin film electrode, in which a groove which penetrates the thin film electrode and the protective layer is formed in at least a portion of an outer peripheral portion in a surface direction of at least one of the upper thin film electrode and the upper protective layer, or the lower thin film electrode and the lower protective layer.

(2) The electroacoustic transduction film according to (1), in which the groove is formed down to a portion of the piezoelectric layer.

(3) The electroacoustic transduction film according to (1) or (2), in which the groove is formed along an entire periphery of the outer peripheral portion in the surface direction of at least one of the upper thin film electrode and the upper protective layer, or the lower thin film electrode and the lower protective layer.

(4) The electroacoustic transduction film according to any one of (1) to (3), in which a width d2 of the groove is greater than or equal to a thickness d1 of the piezoelectric layer.

(5) The electroacoustic transduction film according to any one of (1) to (4), in which a width d2 of the groove, a thickness d1 of the piezoelectric layer, and a voltage V applied between the upper thin film electrode and the lower thin film electrode satisfy $d2 > V/3.5 - d1$.

(6) The electroacoustic transduction film according to any one of (1) to (5), in which the thickness d1 of the piezoelectric layer is 5 to 100 μm.

(7) The electroacoustic transduction film according to any one of (1) to (6), further comprising: an insulating filling portion which fills the groove.

(8) The electroacoustic transduction film according to any one of (1) to (7), in which the piezoelectric layer is a polymer composite piezoelectric body in which piezoelectric body particles are dispersed in a viscoelastic matrix formed of a polymer material having viscoelasticity at a normal temperature.

(9) The electroacoustic transduction film according to (8), in which a local maximum value at which a loss tangent Tan δ at a frequency of 1 Hz becomes greater than or equal to 0.5 due to measurement of a dynamic viscoelasticity of the polymer material is present in a temperature range of 0° C. to 50° C.

(10) The electroacoustic transduction film according to (8) or (9), in which the polymer material has a cyanoethyl group.

(11) The electroacoustic transduction film according to any one of (8) to (10), in which the polymer material is cyanoethylated polyvinyl alcohol.

(12) A manufacturing method of an electroacoustic transduction film, comprising: a preparation step of preparing a laminated body having a piezoelectric layer which stretches and contracts in response to a state of an electric field, an upper thin film electrode formed on one principal surface of the piezoelectric layer, a lower thin film electrode formed on the other principal surface of the piezoelectric layer, an upper protective layer formed on the upper thin film electrode, and a lower protective layer formed on the lower thin film electrode; and a groove forming step of forming a groove which penetrates the thin film electrode and the protective layer in at least a portion of an outer peripheral portion in a surface direction of at least one of the upper thin film electrode and the upper protective layer, or the lower thin film electrode and the lower protective layer, in the laminated body.

(13) The manufacturing method of an electroacoustic transduction film according to (12), further comprising: a heating step of performing an aging treatment by heating the piezoelectric layer after the groove forming step.

(14) The manufacturing method of an electroacoustic transduction film according to (12) or (13), in which in the groove forming step, the groove is formed by processing using a cutting tool or laser processing.

According to the electroacoustic transduction film and the manufacturing method of an electroacoustic transduction film of the present invention, a sound is able to be appropriately generated without the occurrence of dielectric breakdown of the air between the upper and lower thin film electrodes even when a high voltage is applied therebetween, a user is able to be prevented from coming into contact with the piezoelectric layer, and high productivity is achieved.

DESCRIPTION OF THE PREFERRED EMBODIMENTS

Hereinafter, an electroacoustic transduction film and a manufacturing method of an electroacoustic transduction film of the present invention will be described in detail based on preferred embodiments shown in the accompanying drawings.

Descriptions of the constituent elements described below may be made based on representative embodiments of the present invention, but the present invention is not limited to the embodiments.

In this specification, a numerical range expressed by using "to" means a range including numerical values described before and after "to" as a lower limit and an upper limit.

Figure 1A:
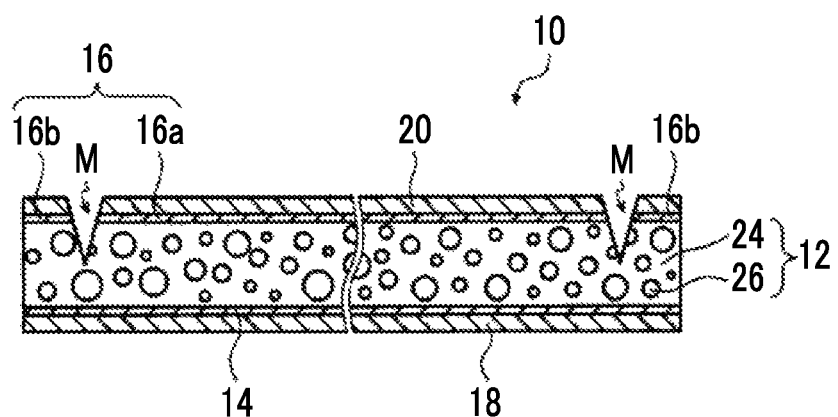
FIG. 1(A) is a schematic sectional view illustrating an example of an electroacoustic transduction film of the present invention.
Figure 1B:
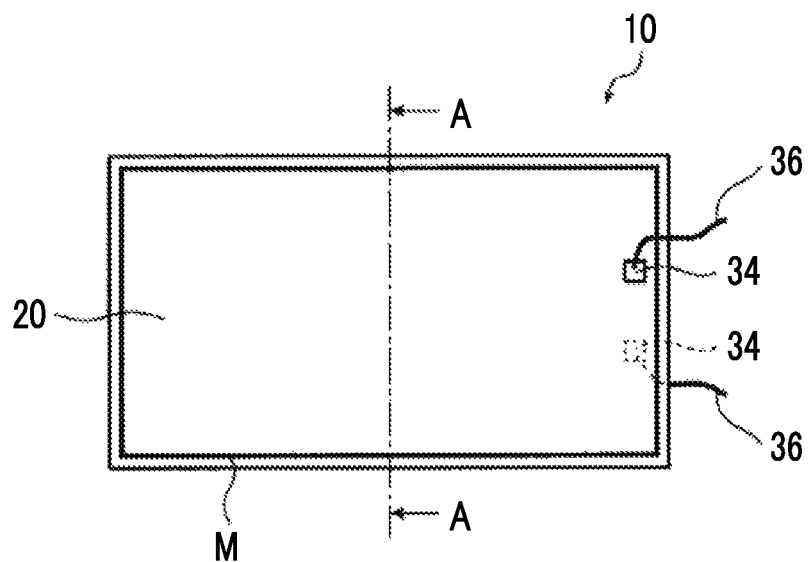
FIG. 1(B) is a plan view of FIG. 1(A).

FIGS. 1(A) and 1(B) conceptually illustrate an example of the electroacoustic transduction film of the present invention. FIG. 1(A) is a schematic sectional view of the electroacoustic transduction film of the present invention, and FIG. 1(B) is a plan view of FIG. 1(A). That is, FIG. 1(A) is a sectional view taken along line A-A of FIG. 1(B).

An electroacoustic transduction film 10 illustrated in FIGS. 1(A) and 1(B) (hereinafter, referred to as a transduction film 10) basically includes a piezoelectric layer 12 which stretches and contracts in response to the state of an electric field, a lower thin film electrode 14 and an upper thin film electrode 16 respectively provided on one surface and the other surface of the piezoelectric layer 12, and a lower protective layer 18 provided on the surface of the lower thin film electrode 14, and an upper protective layer 20 provided on the surface of the upper thin film electrode 16.

The transduction film 10 is used for generating (reproducing) a sound due to a vibration according to an electrical signal or for converting the vibration due to the sound into the electrical signal in various acoustic devices (an acoustic device) such as a pickup used in a speaker, a microphone, and musical instruments such as a guitar.

Here, in the present invention, in the transduction film 10, a groove M which penetrates the thin film electrode and the protective layer is formed in at least a portion of an outer peripheral portion in a surface direction of at least one of the upper thin film electrode 16 and the upper protective layer 20, or the lower thin film electrode 14 and the lower protective layer 18.

In the transduction film 10 illustrated in FIG. 1(A), the groove M penetrates the upper thin film electrode 16 and the upper protective layer 20 and is formed down to a portion of the piezoelectric layer 12. In addition, as illustrated in FIG. 1(B), the groove M is continuously formed along the entire periphery of the outer peripheral portion of the transduction film 10.

With the configuration in which the groove M penetrating the thin film electrodes and the protective layers is formed as described above, the distance between the upper and lower thin film electrodes to which a voltage is applied is able to be increased, and it is possible to prevent the occurrence of dielectric breakdown of the air between the upper and lower thin film electrodes. Accordingly, conversion between a vibration and a voltage is able to be appropriately performed. In addition, with the configuration in which the piezoelectric layer is exposed at the bottom portion of the groove M, a user is able to be prevented from coming into contact with the piezoelectric layer. Furthermore, since the groove M is able to be easily formed by processing using a cutting tool or laser processing, productivity is able to be enhanced.

These points will be described in detail later.

In the transduction film 10 of the present invention, the piezoelectric layer 12 is a layer which has piezoelectric properties and stretches and contracts in an in-plane direction in response to the state of an electric field.

The piezoelectric layer 12 of the transduction film 10 illustrated in FIG. 1(A) is a polymer composite piezoelectric body in which piezoelectric body particles 26 are dispersed in a matrix 24 formed of a polymer material.

In addition, the piezoelectric layer 12 is subjected to polarization processing.

In addition, the piezoelectric body particles 26 in the piezoelectric layer 12 may be dispersed in the viscoelastic matrix 24 with regularity or may also be irregularly dispersed therein.

Here, it is preferable that a polymer material having viscoelasticity at a normal temperature is used as the material of the matrix 24 (matrix-cum-binder) of the polymer composite piezoelectric body configuring the piezoelectric layer 12.

The transduction film 10 of the present invention is suitably used in a speaker having flexibility such as a speaker for a flexible display. Here, it is preferable that the polymer composite piezoelectric body (the piezoelectric layer 12) used in a speaker having flexibility has the following requisites. Therefore, it is preferable to use a polymer material having viscoelasticity at a normal temperature as the material having the following requisites.

Furthermore, herein, the "normal temperature" indicates a temperature range of approximately 0° C. to 50° C.

(i) Flexibility

For example, in a case of being gripped in a state of being loosely bent like a newspaper or a magazine as a portable device, the polymer composite piezoelectric body is continuously subjected to large bending deformation from the outside at a comparatively slow vibration of less than or equal to a few Hz. At this time, when the polymer composite piezoelectric body is hard, large bending stress is generated to that extent, and a crack is generated at the interface between the polymer matrix and the piezoelectric body particles, and thus the piezoelectric layer may be broken. Accordingly, the polymer composite piezoelectric body is required to have suitable flexibility. In addition, when strain energy is diffused into the outside as heat, the stress is able to be relieved. Accordingly, the loss tangent of the polymer composite piezoelectric body is required to be suitably large.

(ii) Acoustic Quality

In the speaker, the piezoelectric body particles vibrate at a frequency of an audio band of 20 Hz to 20 kHz, and the entire vibration plate (the polymer composite piezoelectric body) integrally vibrates due to the vibration energy, and thus a sound is reproduced. Accordingly, in order to increase the transmission efficiency of the vibration energy, the polymer composite piezoelectric body is required to have suitable hardness. In addition, when the frequency properties of the speaker become smooth, the changed amount of the acoustic quality at the time that the lowest resonance frequency $f_0$ is changed according to a change in the curvature also decreases. Accordingly, the loss tangent of the polymer composite piezoelectric body is required to be suitably large.

As described above, the polymer composite piezoelectric body used in a speaker having flexibility is required to be rigid with respect to a vibration of 20 Hz to 20 kHz, and to be flexible with respect to a vibration of less than or equal to a few Hz. In addition, the loss tangent of the polymer composite piezoelectric body is required to be suitably large with respect to the vibration of all frequencies of less than or equal to 20 kHz.

In general, a polymer solid has a viscoelasticity relieving mechanism, and a molecular movement having a large scale is observed as a decrease (relief) in a storage elastic modulus (Young's modulus) or the local maximum (absorption) in a loss elastic modulus along with an increase in a temperature or a decrease in a frequency. Among them, the relief due to a microbrown movement of a molecular chain in an amorphous region is referred to as main dispersion, and an extremely large relieving phenomenon is observed. A temperature at which this main dispersion occurs is a glass transition point (Tg), and the viscoelasticity relieving mechanism is most remarkably observed.

In the polymer composite piezoelectric body (the piezoelectric layer 12), the polymer material of which the glass transition point is a normal temperature, in other words, the polymer material having viscoelasticity at a normal temperature is used in the matrix, and thus the polymer composite piezoelectric body which is rigid with respect to a vibration of 20 Hz to 20 kHz and is flexible with respect to a vibration of less than or equal to a few Hz is realized. In particular, from a viewpoint of preferably exhibiting such behavior, it is preferable that a polymer material of which the glass transition temperature at a frequency of 1 Hz is a normal temperature, that is, 0° C. to 50° C. is used in the matrix of the polymer composite piezoelectric body.

As the polymer material having viscoelasticity at a normal temperature, various known materials are able to be used. Preferably, a polymer material of which the local maximum value of a loss tangent Tan δ at a frequency of 1 Hz at a normal temperature, that is, 0° C. to 50° C. in a dynamic viscoelasticity test is greater than or equal to 0.5 is used.

Accordingly, when the polymer composite piezoelectric body is slowly bent due to an external force, stress concentration on the interface between the polymer matrix and the piezoelectric body particles at the maximum bending moment portion is relieved, and thus high flexibility is able to be expected.

In addition, it is preferable that, in the polymer material, a storage elastic modulus (E') at a frequency of 1 Hz according to dynamic viscoelasticity measurement is greater than or equal to 100 MPa at 0° C. and is less than or equal to 10 MPa at 50° C.

Accordingly, it is possible to reduce a bending moment which is generated at the time that the polymer composite piezoelectric body is slowly bent due to the external force, and it is possible to make the polymer composite piezoelectric body rigid with respect to an acoustic vibration of 20 Hz to 20 kHz.

In addition, it is more preferable that the relative permittivity of the polymer material is greater than or equal to 10 at 25° C. Accordingly, when a voltage is applied to the polymer composite piezoelectric body, a higher electric field is applied to the piezoelectric body particles in the polymer matrix, and thus a large deformation amount is able to be expected.

However, in consideration of ensuring excellent moisture resistance or the like, it is preferable that the relative permittivity of the polymer material is less than or equal to 10 at 25° C.

As the polymer material satisfying such conditions, cyanoethylated polyvinyl alcohol (cyanoethylated PVA), polyvinyl acetate, polyvinylidene chloride coacrylonitrile, a polystyrene-vinyl polyisoprene block copolymer, polyvinyl methyl ketone, polybutyl methacrylate, and the like are exemplified. In addition, as these polymer materials, a commercially available product such as Hybrar 5127 (manufactured by Kuraray Co., Ltd.) is also able to be suitably used. Among them, a material having a cyanoethyl group is preferably used, and cyanoethylated PVA is particularly preferably used.

Furthermore, only one of these polymer materials may be used, or a plurality of types thereof may be used in combination (mixture).

The matrix 24 using such a polymer material having viscoelasticity at a normal temperature, as necessary, may use a plurality of polymer materials in combination.

That is, in order to adjust dielectric properties or mechanical properties, other dielectric polymer materials may be added to the matrix 24 in addition to the viscoelastic material such as cyanoethylated PVA, as necessary.

As the dielectric polymer material which is able to be added to the matrix 24, for example, a fluorine-based polymer such as polyvinylidene fluoride, a vinylidene fluoride-tetrafluoroethylene copolymer, a vinylidene fluoride-trifluoroethylene copolymer, a polyvinylidene fluoride-trifluoroethylene copolymer, and a polyvinylidene fluoride-tetrafluoroethylene copolymer, a polymer having a cyano group or a cyanoethyl group such as a vinylidene cyanide-vinyl acetate copolymer, cyanoethyl cellulose, cyanoethyl hydroxy saccharose, cyanoethyl hydroxy cellulose, cyanoethyl hydroxy pullulan, cyanoethyl methacrylate, cyanoethyl acrylate, cyanoethyl hydroxy ethyl cellulose, cyanoethyl amylose, cyanoethyl hydroxy propyl cellulose, cyanoethyl dihydroxy propyl cellulose, cyanoethyl hydroxy propyl amylose, cyanoethyl polyacryl amide, cyanoethyl polyacrylate, cyanoethyl pullulan, cyanoethyl polyhydroxy methylene, cyanoethyl glycidol pullulan, cyanoethyl saccharose, and cyanoethyl sorbitol, a synthetic rubber such as nitrile rubber or chloroprene rubber, and the like are exemplified.

Among them, a polymer material having a cyanoethyl group is suitably used.

Furthermore, the dielectric polymer added to the matrix 24 of the piezoelectric layer 12 in addition to the material having viscoelasticity at a normal temperature such as cyanoethylated PVA is not limited to one dielectric polymer, and a plurality of dielectric polymers may be added.

In addition, in order to adjust the glass transition point (Tg), a thermoplastic resin such as a vinyl chloride resin, polyethylene, polystyrene, a methacrylic resin, polybutene, and isobutylene, and a thermosetting resin such as a phenol resin, a urea resin, a melamine resin, an alkyd resin, and mica may be added in addition to the dielectric polymer material.

Furthermore, in order to improve pressure sensitive adhesiveness, a viscosity imparting agent such as rosin ester, rosin, terpene, terpene phenol, and a petroleum resin may be added.

In the matrix 24 of the piezoelectric layer 12, the added amount at the time of adding a polymer in addition to the viscoelastic material such as cyanoethylated PVA is not particularly limited, and it is preferable that a ratio of the added polymer to the matrix 24 is less than or equal to 30 vol %.

Accordingly, it is possible to exhibit the properties of the polymer material to be added without impairing the viscoelasticity relieving mechanism of the matrix 24, and thus a preferred result is able to be obtained from a viewpoint of increasing a dielectric constant, of improving heat resistance, and of improving adhesiveness between the piezoelectric body particles 26 and the electrode layer.

Furthermore, in the present invention, the material of the matrix 24 is not limited to the polymer material having viscoelasticity at a normal temperature and may also use the above-mentioned dielectric polymer or the like.

The piezoelectric body particles 26 are formed of ceramics particles having a perovskite type or wurtzite type crystal structure.

As the ceramics particles configuring the piezoelectric body particles 26, for example, lead zirconate titanate (PZT), lead lanthanum zirconate titanate (PLZT), barium titanate ($BaTiO_3$), zinc oxide (ZnO), a solid solution (BFBT) of barium titanate and bismuth ferrite ($BiFe_3$), and the like are exemplified.

The particle diameter of the piezoelectric body particles 26 may be appropriately selected according to the size or usage of the transduction film 10, and is preferably 1 μm to 10 μm according to the consideration of the present inventors.

By setting the particle diameter of the piezoelectric body particles 26 to be in the range described above, a preferred result is able to be obtained from a viewpoint of making high piezoelectric properties and flexibility compatible.

In addition, in FIG. 1(A), the piezoelectric body particles 26 in the piezoelectric layer 12 are irregularly dispersed in the matrix 24. However, the piezoelectric body particles 26 may also be uniformly dispersed therein with regularity.

In the transduction film 10 of the present invention, a quantitative ratio of the matrix 24 and the piezoelectric body particles 26 in the piezoelectric layer 12 may be appropriately set according to the size in the surface direction or the thickness of the transduction film 10, the usage of the transduction film 10, properties required for the transduction film 10, and the like.

Here, according to the consideration of the present inventors, the volume fraction of the piezoelectric body particles 26 in the piezoelectric layer 12 is preferably 30% to 70%, particularly preferably greater than or equal to 50%. Therefore, the volume fraction thereof is more preferably 50% to 70%.

By setting the quantitative ratio of the matrix 24 and the piezoelectric body particles 26 to be in the range described above, it is possible to obtain a preferred result from a viewpoint of making high piezoelectric properties and flexibility compatible.

In addition, in the transduction film 10 of the present invention, the thickness of the piezoelectric layer 12 is not also particularly limited, and may be appropriately set according to the size of the transduction film 10, the usage of the transduction film 10, properties required for the transduction film 10, and the like.

Here, according to the consideration of the present inventors, the thickness of the piezoelectric layer 12 is preferably 5 to 100 μm, more preferably 5 to 50 μm, and particularly preferably 5 to 30 μm.

By setting the thickness of the piezoelectric layer 12 to be in the range described above, it is possible to obtain a preferred result from a viewpoint of making ensuring rigidity and appropriate flexibility compatible.

Furthermore, as described above, it is preferable that the piezoelectric layer 12 is subjected to polarization processing (poling). The polarization processing will be described below in detail.

In addition, in the embodiment described above, the polymer composite piezoelectric body is used as the piezoelectric layer 12. However, the present invention is not limited thereto, and a polymer piezoelectric material having piezoelectric properties, such as polyvinylidene fluoride (PVDF) may also be used.

While monoaxially stretched PVDF has in-plane anisotropy in the piezoelectric properties thereof, the polymer composite piezoelectric body does not have in-plane anisotropy. Therefore, the polymer composite piezoelectric body is able to more suitably convert a stretching and contracting movement into a forward and rearward movement compared to PVDF and is thus able to obtain acoustic quality with a sufficient sound volume, which is preferable.

As illustrated in FIG. 1(A), the transduction film 10 of the present invention has a configuration in which the piezoelectric layer 12 is interposed between the lower thin film electrode 14 and the upper thin film electrode 16, and this laminated body is interposed between the lower protective layer 18 and the upper protective layer 20.

In the transduction film 10, the lower protective layer 18 and the upper protective layer 20 have a function of applying appropriate rigidity and mechanical strength to the polymer composite piezoelectric body. That is, there may be a case where, in the transduction film 10 of the present invention, the polymer composite piezoelectric body (the piezoelectric layer 12) consisting of the matrix 24 and the piezoelectric body particles 26 exhibits extremely superior flexibility under bending deformation at a slow vibration but has insufficient rigidity or mechanical strength depending on the usage. For compensation for this, the transduction film 10 is provided with the lower protective layer 18 and the upper protective layer 20.

In addition, since the lower protective layer 18 and the upper protective layer 20 are different from each other only in position and have the same configuration, in the following description, in a case where there is no need to distinguish between the lower protective layer 18 and the upper protective layer 20, both the members are collectively referred to as a protective layer.

The protective layer is not particularly limited, and may use various sheet-like materials. As an example, various resin films (plastic films) are suitably exemplified. Among them, by the reason of excellent mechanical properties and heat resistance, polyethylene terephthalate (PET), polypropylene (PP), polystyrene (PS), polycarbonate (PC), polyphenylene sulfite (PPS), polymethyl methacrylate (PMMA), polyetherimide (PEI), polyimide (PI), polyethylene naphthalate (PEN), triacetylcellulose (TAC), polyamide (PA, aramid), and a cyclic olefin-based resin are suitably used.

Among them, polyamide, polyimide, polyetherimide, polycarbonate, and triacetylcellulose are suitably used from a viewpoint of exhibiting excellent heat resistance by causing the glass transition temperature Tg to be 150° C. or higher. From these, damage to the appearance due to heat generated at the time of applying a voltage is able to be prevented, and it is possible to withstand a shelf test and a driving test at a high temperature.

The thicknesses of the protective layers are not particularly limited. In addition, the thicknesses of the protective layers may be basically identical to each other or different from each other.

Here, when the rigidity of the protective layer excessively increases, not only is the stretching and contracting of the piezoelectric layer 12 constrained, but also the flexibility is impaired, and thus it is advantageous as the thickness of the protective layer becomes thinner unless mechanical strength or excellent handling ability as a sheet-like material is required.

Here, according to the consideration of the present inventors, when the thickness of each of the protective layers is less than or equal to twice the thickness of the piezoelectric layer 12, it is possible to obtain a preferred result from a viewpoint of compatibility between ensuring of the rigidity and appropriate flexibility, or the like.

For example, in a case where the thickness of the piezoelectric layer 12 is 50 µm and the lower protective layer 18 and the upper protective layer 20 are formed of PET, the thickness of each of the lower protective layer 18 and the upper protective layer 20 is preferably less than or equal to 100 µm, and more preferably less than or equal to 50 µm, and particularly preferably less than or equal to 25 µm.

In addition, as described above, since the polymer material used in the present invention has a low relative dielectric constant and excellent moisture resistance, it is not necessary to form a protective layer for moisture resistance. Therefore, the protective layer may be thinned or may not be provided, thereby improving flexibility.

In the transduction film 10 of the present invention, the lower thin film electrode 14 is formed between the piezoelectric layer 12 and the lower protective layer 18, and the upper thin film electrode 16 is formed between the piezoelectric layer 12 and the upper protective layer 20.

The lower thin film electrode 14 and the upper thin film electrode 16 are provided to apply a voltage to the transduction film 10.

In addition, since the lower thin film electrode 14 and the upper thin film electrode 16 are different from each other only in position and have the same configuration, in the following description, in a case where there is no need to distinguish between the lower thin film electrode 14 and the upper thin film electrode 16, both the members are collectively referred to as a thin film electrode.

In the present invention, a forming material of the thin film electrode is not particularly limited, and as the forming material, various conductive bodies are able to be used. Specifically, carbon, palladium, iron, tin, aluminum, nickel, platinum, gold, silver, copper, chromium, molybdenum, or an alloy thereof, indium-tin oxide, and the like are exemplified. Among them, any one of copper, aluminum, gold, silver, platinum, and indium-tin oxide is suitably exemplified.

In addition, a forming method of the thin film electrode is not particularly limited, and as the forming method, various known methods such as a vapor-phase deposition method (a vacuum film forming method) such as vacuum vapor deposition or sputtering, film formation using plating, and a method of adhering a foil formed of the materials described above are able to be used.

Among them, in particular, by the reason that the flexibility of the transduction film 10 is able to be ensured, a copper or aluminum thin film formed by using the vacuum vapor deposition is suitably used as the thin film electrode. Among them, in particular, the copper thin film formed by using the vacuum vapor deposition is suitably used.

The thicknesses of the thin film electrodes are not particularly limited. In addition, the thicknesses of the thin film electrodes may be basically identical to each other or different from each other.

Here, like the protective layer described above, when the rigidity of the thin film electrode excessively increases, not only is stretching and contracting of the piezoelectric layer 12 constrained, but also flexibility is impaired. For this reason, when the thin film electrode is in a range where electrical resistance does not excessively increase, it is advantageous as the thickness becomes thinner.

In addition, according to the consideration of the present inventors, when the product of the thickness of the thin film electrode and the Young's modulus is less than the product of the thickness of the protective layer and the Young's modulus, the flexibility is not considerably impaired, which is suitable.

For example, in a case of a combination of the protective layer formed of PET (Young's modulus: approximately 6.2 GPa) and the thin film electrode formed of copper (Young's modulus: approximately 130 GPa), when the thickness of the protective layer is 25 vim, the thickness of the thin film electrode is preferably less than or equal to 1.2 µm, more preferably less than or equal to 0.3 µm, and particularly preferably less than or equal to 0.1 µm.

As described above, in the transduction film 10 of the present invention, the piezoelectric layer 12 (the polymer composite piezoelectric body) in which the piezoelectric body particles 26 are dispersed in the matrix 24 is interposed between the lower thin film electrode 14 and the upper thin film electrode 16, and this laminated body is interposed between the lower protective layer 18 and the upper protective layer 20.

In the transduction film 10 of the present invention, it is preferable that the local maximum value in which the loss tangent (Tan δ) at a frequency of 1 Hz according to the dynamic viscoelasticity measurement is greater than or equal to 0.5 exists at a normal temperature.

Accordingly, even when the transduction film 10 is subjected to large bending deformation from the outside at a comparatively slow vibration of less than or equal to a few Hz, it is possible to effectively diffuse the strain energy to the outside as heat, and thus it is possible to prevent a crack from being generated on the interface between the polymer matrix and the piezoelectric body particles.

In the transduction film 10 of the present invention, it is preferable that the storage elastic modulus (E') at a frequency of 1 Hz according to the dynamic viscoelasticity measurement is 10 GPa to 30 GPa at 0° C., and 1 GPa to 10 GPa at 50° C.

Accordingly, the transduction film 10 is able to have large frequency dispersion in the storage elastic modulus (E') at a normal temperature. That is, the transduction film 10 is able to be rigid with respect to a vibration of 20 Hz to 20 kHz, and is able to be flexible with respect to a vibration of less than or equal to a few Hz.

In addition, in the transduction film 10 of the present invention, it is preferable that the product of the thickness and the storage elastic modulus (E') at a frequency of 1 Hz according to the dynamic viscoelasticity measurement is $1.0 \times 10^6$ N/m to $2.0 \times 10^6$ (1.0E+06 to 2.0E+06) N/m at 0° C., and $1.0 \times 10^5$ N/m to $1.0 \times 10^6$ (1.0E+05 to 1.0E+06) N/m at 50° C.

Accordingly, the transduction film 10 is able to have appropriate rigidity and mechanical strength within a range not impairing the flexibility and the acoustic properties of the transduction film 10.

Furthermore, in the transduction film 10 of the present invention, it is preferable that the loss tangent (Tan δ) at a frequency of 1 kHz at 25° C. is greater than or equal to 0.05 in a master curve obtained by the dynamic viscoelasticity measurement.

Accordingly, the frequency properties of the speaker using the transduction film 10 become smooth, and thus it is also possible to decrease the changed amount of the acoustic quality at the time that the lowest resonance frequency $f_0$ is changed according to the change in the curvature of the speaker.

Here, as described above, the transduction film 10 of the present invention has a configuration having the groove M which is formed in at least a portion of the outer peripheral portion in the surface direction of at least one of the upper thin film electrode 16 and the upper protective layer 20, or the lower thin film electrode 14 and the lower protective layer 18 to penetrate the thin film electrodes and the protective layers.

In the transduction film 10 illustrated in FIG. 1(A), the groove M is formed on the side of the upper thin film electrode 16 and the upper protective layer 20. The shape of the groove M of the illustrated example in a section perpendicular to the extension direction is a V shape and penetrates the upper thin film electrode 16 and the upper protective layer 20 to be formed down to a depth of approximately half the thickness of the piezoelectric layer 12.

In addition, as illustrated in FIG. 1(B), the groove M is continuously formed along the entire periphery of the outer peripheral portion of the transduction film 10, and the upper thin film electrode 16 and the upper protective layer 20 are divided into a region on the inside of the groove M in the surface direction and a region on the outside of the groove M. That is, the upper thin film electrode 16 at a position of the end surface of the transduction film 10 is included in the region on the outside of the groove M.

In the following description, the thin film electrode and the protective layer in the region on the inside of the groove M are referred to as a thin film electrode and a protective layer on the inside, and the thin film electrode and the protective layer in the region on the outside of the groove M are referred to as a thin film electrode and a protective layer on the outside. In addition, the thin film electrode on the outside is also referred to as a floating electrode.

Furthermore, as illustrated in FIG. 1(B), an electrode lead-out portion 34 is provided in an upper thin film electrode 16a on the inside. That is, a voltage for driving the transduction film 10 is applied between the upper thin film electrode 16a on the inside and the lower thin film electrode 14, and no voltage is applied to an upper thin film electrode 16b on the outside. Therefore, the distance in a space between the end portion of the upper thin film electrode 16a on the inside and the end portion of the lower thin film electrode 14, to which a voltage is applied, becomes greater than the thickness of the piezoelectric layer.

As described above, in an electroacoustic transduction film obtained by forming thin film electrodes on both surfaces of a piezoelectric layer, the thickness of the piezoelectric layer is extremely small, and the distance between the upper and lower thin film electrodes is short. Therefore, it could be seen that when a high voltage is applied between the thin film electrodes, in the end portions thereof, dielectric breakdown of the air occurs between the upper and lower thin film electrodes, and there are problems that the voltage is not applied to the piezoelectric layer and a sound is not reproduced.

It is considered that the size of the thin film electrode is reduced to be smaller than the piezoelectric layer in order to increase the distance between the thin film electrodes. However, in this configuration, there is concern that the strength of the outer peripheral portion may decrease. In addition, since there is a case where the material of the piezoelectric layer is harmful to the human body, it is necessary to cover the end portions with an insulating sheet or the like. Therefore, a step of attaching the insulating sheet to the end portions is necessary, and there is a problem that the manufacturing efficiency deteriorates.

In contrast, since the transduction film 10 of the present invention has the groove M which is formed in at least a portion of the outer peripheral portion in the surface direction of at least one of the upper thin film electrode 16 and the upper protective layer 20, or the lower thin film electrode 14 and the lower protective layer 18 to penetrate the thin film electrodes and the protective layers, the distance in a space between the end portion of the thin film electrode on the inside and the end portion of the other thin film electrode, to which a voltage is applied, becomes greater than the thickness of the piezoelectric layer. Therefore, it is possible to prevent the occurrence of dielectric breakdown of the air between the upper and lower thin film electrodes. Therefore, even in a case where a high voltage is applied, conversion between a vibration (sound) and a voltage is able to be appropriately performed.

In addition, since the configuration in which the piezoelectric layer is exposed at the bottom portion of the groove M is provided, that is, since the piezoelectric layer is only exposed at the bottom surface of a recessed portion, it is possible to prevent a user from easily contacting the piezoelectric layer.

In addition, since the groove M is able to be easily formed by processing using a cutting tool or laser processing, productivity is able to be enhanced.

Figure 2:
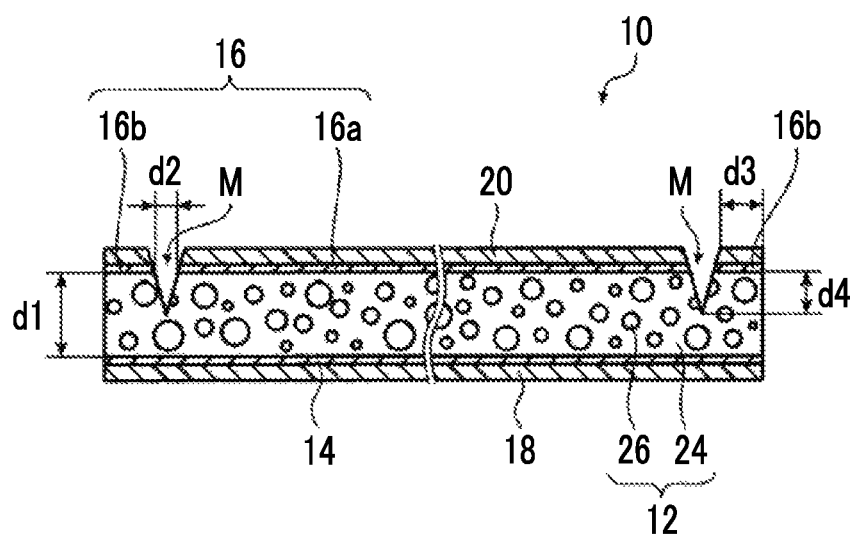
FIG. 2 is a schematic sectional view for illustrating the dimensions of a groove.

Specifically, assuming that the thickness of the piezoelectric layer 12 is d1 (μm) and the width of the groove M at the position of the upper thin film electrode 16 in a section perpendicular to the extension direction is d2 (μm) (see FIG. 2), the distance in the space between the end portion of the upper thin film electrode 16a on the inside and the end portion of the lower thin film electrode 14 is d1+d2. Therefore, assuming that the voltage applied between the upper thin film electrode 16a on the inside and the lower thin film electrode 14 is $V_{total}$ (V), the voltage V1 (V) applied between the floating electrode 16b and the lower thin film electrode 14 is $V1=(d1/(d1+d2)) \times V_{total}$, which is smaller than the voltage applied between the upper thin film electrode 16a on the inside and the lower thin film electrode 14. Therefore, it is possible to prevent the occurrence of dielectric breakdown of the air between the upper and lower thin film electrodes. In addition, $V_{total}$ (V) is the peak-peak value of a sinusoidal AC voltage.

Here, since the electric field for dielectric breakdown of the air is approximately 3.5 V/μm, $V1 < 3.5 \times d1$ is the condition under which dielectric breakdown does not occur. Therefore, from the two expressions, it is preferable that the width d2 of the groove M satisfies $d2 > V_{total}/3.5 - d1$. Accordingly, it is possible to more reliably prevent the occurrence of dielectric breakdown between the upper thin film electrode 16 and the lower thin film electrode 14.

In addition, from viewpoints of ensuring strength, ensuring the size of a substantial driving surface of the transduction film, a machining surface, and the like for reliably preventing the occurrence of dielectric breakdown, the width d2 of the groove M is preferably greater than or equal to the thickness d1 of the piezoelectric layer 12, more preferably greater than or equal to twice the thickness d1 of the piezoelectric layer 12, and particularly preferably greater than or equal to 100 µm and less than or equal to 1000 µm.

In addition, it is preferable that the distance d3 from the edge of the transduction film 10 to the groove M in the surface direction (see FIG. 2) is large from a viewpoint of ensuring the strength of the transduction film. On the other hand, when the distance d3 is too large, the size of the thin film electrode on the inside becomes small, and the size of the substantial driving surface of the transduction film becomes small, possibly deteriorating the acoustic properties. Therefore, from the above viewpoint, the distance d3 from the edge of the transduction film 10 to the groove M is preferably 0.5 mm to 50 mm, and more preferably 3 mm to 10 mm.

Furthermore, the depth of the groove M is not particularly limited as long as the groove M is formed so as to reach at least the position of the thin film electrode on the side where the groove M is formed and so as not to reach the other thin film electrode, that is, so as to cause a portion of the piezoelectric layer 12 to remain.

From a viewpoint of ensuring the strength of the transduction film, the depth d4 (see FIG. 2) of the groove M in the piezoelectric layer 12 in a case where the groove M is formed down to a portion of the piezoelectric layer 12 is preferably less than or equal to 80% of the thickness of the piezoelectric layer 12, and more preferably less than or equal to 50% of the thickness of the piezoelectric layer 12.

In addition, regarding various dimensions of the groove M, five section photographs (magnification 1000 times) were photographed by a field emission scanning electron microscope (FE-SEM) and the average value of the measured values was used.

Furthermore, other effects of the present invention will be described with reference to FIGS. 3(A) and 3(B).

Figure 3A:
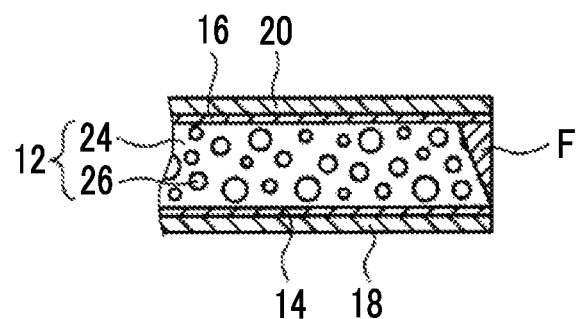
FIGS. 3(A) and 3(B) are schematic sectional views illustrating one of the actions of the present invention.
Figure 3B:
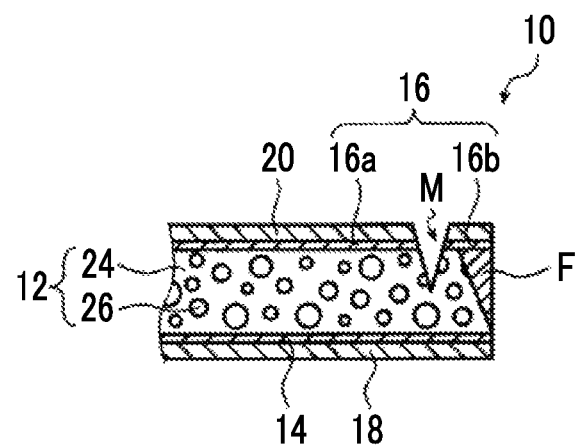

FIGS. 3(A) and 3(B) are schematic sectional views of the end portion of the transduction film.

As will be described in detail later, the thin film electrode is formed on the protective layer by vacuum vapor deposition or the like, and is thereafter attached to the piezoelectric layer 12. At this time, there may be a case where a burr F present at the edge portion of the thin film electrode bites into the piezoelectric layer 12 and the upper and lower thin film electrodes are electrically connected to each other (see FIG. 3(A)). When the upper and lower thin film electrodes are electrically connected to each other, there is concern that current may leak and conversion between a vibration (sound) and a voltage may not be performed.

In contrast, in the transduction film of the present invention, since at least a portion of the outer peripheral portion in the surface direction has the groove M formed to penetrate the thin film electrode and the protective layer, as illustrated in FIG. 3(B), the burr F present at the edge is separated from the upper thin film electrode 16a on the inside together with the floating electrode 16b. Accordingly, it is possible to prevent the upper and lower thin film electrodes from being electrically connected to each other.

Here, the shape and the like of the electrode lead-out portion 34 are not particularly limited.

For example, a portion of the protective layer is removed to form a hole, and a conductive material such as a silver paste is inserted into the hole to electrically connect the conductive material to the thin film electrode such that the electrode lead-out portion 34 is formed.

By connecting a wire 36 or the like to the electrode lead-out portion 34 (conductive material), the thin film electrode and an external device or the like can be easily electrically connected to each other.

Since the thin film electrode is a very thin metal layer, in a state in which a portion of the protective layer is completely removed and the thin film electrode is exposed on the surface of the transduction film 10, the thin film electrode is easily oxidized depending on the storage environment, resulting in a reduction in conductivity. Accordingly, there is concern that the transduction film may not be appropriately driven.

Therefore, for example, it is preferable that a part in which a portion of the protective layer is thinned (hereinafter, referred to as a thin layer portion) is formed by forming a recessed portion by removing a portion of the protective layer, a conductive material such as a silver paste is inserted into the thin layer portion, the protective layer is broken by pressing the conductive material to electrically connect the conductive material and the thin film electrode to each other so as to form the electrode lead-out portion 34. Accordingly, since the thin film electrode is entirely covered with the protective layer, the thin film electrode is not deteriorated by oxidation or the like, and the durability at the time of storage is excellent.

In the case of forming the electrode lead-out portion 34 by forming the thin layer portion in the protective layer, the thickness of the thin layer portion is preferably 1% to 50% of the thickness of the protective layer, and more preferably 1.5% to 25%.

By setting the thickness of the thin layer portion to be in the range described above, it is possible to ensure the effect of protecting the thin film electrode by the protective layer in the thin layer portion, to prevent oxidation, damage, and the like of the thin film electrode, and to reliably break the thin layer portion by the conductive layer, which is preferable.

The size and position in the surface direction of the thin layer portion are not particularly limited and may be appropriately set according to the shape in the surface direction of the transduction film 10, the configuration of a device or equipment in which the transduction film 10 is used, and the like. In addition, the thin layer portion in the protective layer on the side where the groove M is formed may be formed in the thin film electrode on the inside.

Furthermore, the shape in the surface direction of the thin layer portion is not particularly limited, and various shapes such as a circular shape, a triangular shape, and a polygonal shape such as a square shape, an elliptical shape, and an irregular shape are able to be used.

Furthermore, the thin layer portion may be formed after manufacturing the transduction film, or may be formed at the stage of the sheet-like material on which the thin film electrode is formed on the protective layer. Alternatively, the thin layer portion may be formed in a single protective layer form.

As a forming method of the thin layer portion, various known methods are able to be used according to the forming material of the protective layer.

As an example, a method of forming the thin layer portion by removing the protective layer by ablating the protective layer with a laser beam such as a laser beam having a wavelength of 10.6 µm from a carbon dioxide laser is exemplified. For example, by scanning the formation position of the thin layer portion in the protective layer with the laser beam, the thin layer portion may be formed at a desired position of the protective layer. At this time, it is possible to form the thin layer portion having a desired thickness by controlling the intensity of the laser beam, the scanning speed (that is, a processing time by the laser beam), and the like.

In addition, a method of forming the thin layer portion by dissolving the protective layer using an organic solvent may also be used. For example, when the protective layer is formed of PET, the thin layer portion is able to be formed using hexafluoroisopropanol or the like. In a case where a solvent is used, the thin layer portion may be formed at a desired position by using a mask or the like similarly to etching in photolithography or the like. At this time, by adjusting the treatment time and the concentration of the organic solvent, the thin layer portion having a desired thickness is able to be formed.

Furthermore, the thin layer portion may also be formed by a mechanical method such as perforation by grinding. At this time, the thin layer portion having a desired thickness is able to be formed by controlling the treatment strength or the like.

Alternatively, a method of preparing the protective layer having the thin layer portion by preparing a sheet-like material having the same thickness as an intended thin layer portion and laminating, on the sheet-like material, a sheet-like material having a through-hole that is to become the thin layer portion is able to be used.

Here, in the example illustrated in FIG. 1(A), the shape of the groove M in the section perpendicular to the extension direction is a V shape, but the shape thereof is not limited thereto, and may be various shapes.

Figure 4A:
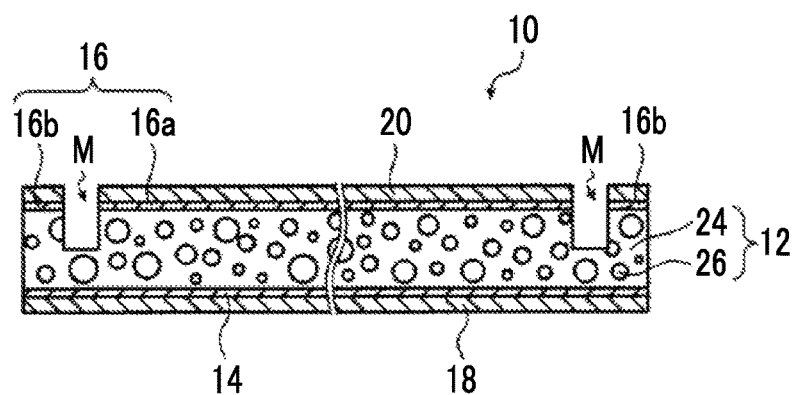
FIGS. 4(A) and 4(B) are schematic sectional views respectively illustrating other examples of the electroacoustic transduction film of the present invention.
Figure 4B:
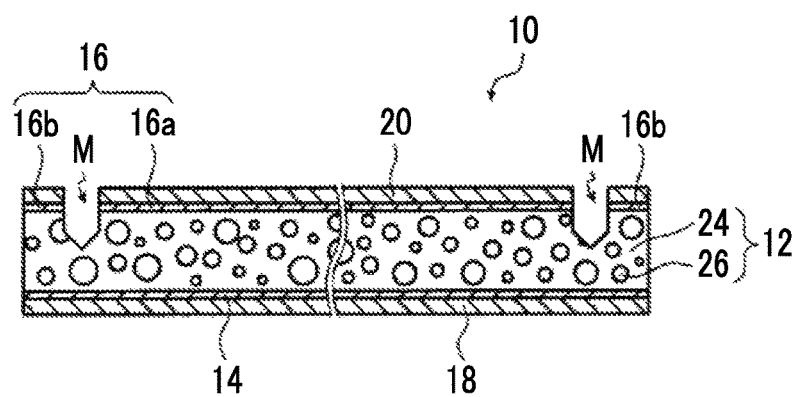

For example, the shape may be a rectangular shape as illustrated in FIG. 4(A), or may be a shape obtained by combining a rectangular shape and a triangular shape in which the tip in the depth direction decreases in thickness as illustrated in FIG. 4(B).

The sectional shape of the groove M is able to be observed by taking a sectional photograph by a scanning electron microscope (SEM).

In the example illustrated in FIG. 1(A), the groove M is provided on the side of the upper thin film electrode 16 and the upper protective layer 20, but the groove M is not limited thereto. That is, a groove that penetrates the lower thin film electrode 14 and the lower protective layer 18 may be formed on the side of the lower thin film electrode 14 and the lower protective layer 18. Alternatively, a groove that penetrates the upper thin film electrode 16 and the upper protective layer 20 may be provided on the side of the upper thin film electrode 16 and the upper protective layer 20, and a groove that penetrates the lower thin film electrode 14 and the lower protective layer 18 may be formed on the side of the lower thin film electrode 14 and the lower protective layer 18.

In the example shown in FIG. 1(B), the groove M is configured to be continuously formed along the entire periphery of the outer peripheral portion of the transduction film 10, that is, the groove M is configured to be formed in a closed annular shape. However, the groove M is not limited thereto. For example, in a case where the transduction film 10 has a rectangular shape, a configuration in which the groove M is provided at each edge on the side of the upper thin film electrode 16 and the upper protective layer 20 or on the side of the lower thin film electrode 14 and the lower protective layer 18 may be adopted. That is, a plurality of grooves M may be provided such that the entire periphery of the outer peripheral portion of the transduction film 10 is surrounded by the plurality of grooves M.

Specifically, for example, a configuration in which grooves M are provided on the side of one set of opposing edges on the side of the upper thin film electrode 16 and the upper protective layer 20 to extend in a direction parallel to these edges and grooves M are provided on the side of the other set of opposing edges on the side of the lower thin film electrode 14 and the lower protective layer 18 to extend in a direction parallel to these edges may be adopted. That is, a configuration in which, when the transduction film 10 is viewed from above as illustrated in FIG. 1(B), grooves M are provided on the side of left and right edges on the side of the upper thin film electrode 16 and the upper protective layer 20 and grooves M are provided on the side of upper and lower edges on the side of the lower thin film electrode 14 and the lower protective layer 18.

Even in a case of adopting a configuration in which the groove M is not continuously formed along the entire periphery of the outer peripheral portion of the transduction film 10, it is necessary for the groove M to be formed to electrically separate the thin film electrode on the inside and the thin film electrode on the outside (floating electrode) from each other. Therefore, for example, in a case where the groove M is provided on the edge side where the transduction film having a rectangular shape is present, the groove M is formed in the entire area between two sides adjacent to the edge.

In addition, the groove M is not also limited to the configuration having the groove M along the entire periphery of the outer peripheral portion of the transduction film 10.

Figure 5A:
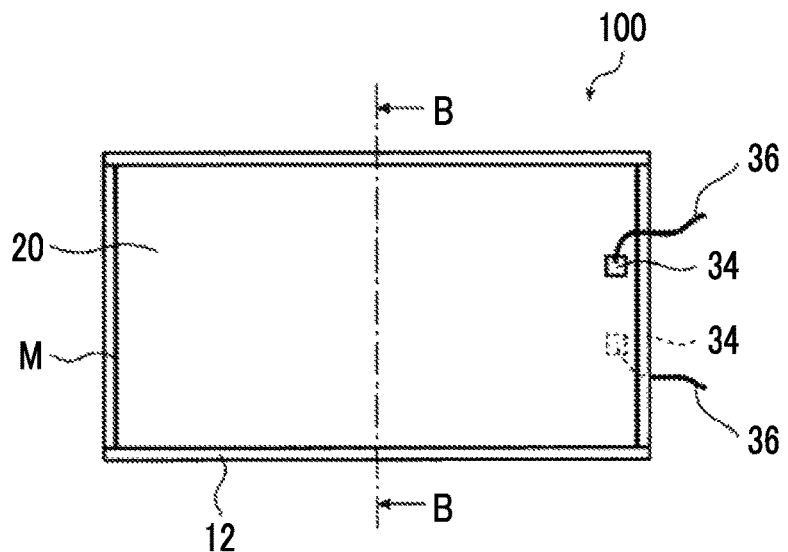
FIG. 5(A) is a schematic plan view illustrating another example of the electroacoustic transduction film of the present invention.
Figure 5B:
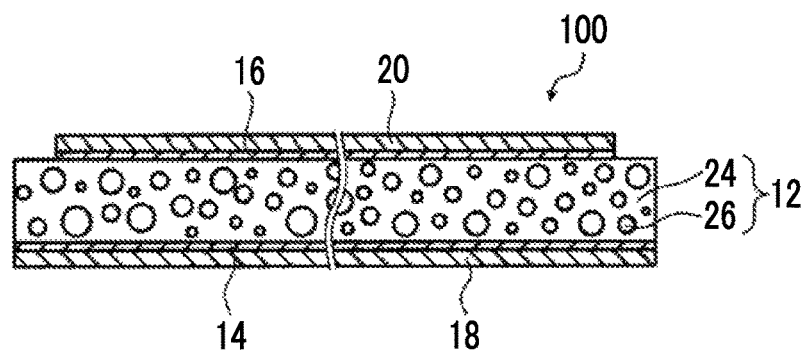
FIG. 5(B) is a sectional view taken along line B-B of FIG. 5(A).

FIG. 5(A) is a schematic plan view of another example of the electroacoustic transduction film of the present invention, and FIG. 5(B) is a sectional view taken along line B-B of FIG. 5(A).

A transduction film 100 illustrated in FIGS. 5(A) and 5(B) is formed so that the length in the vertical direction in FIG. 5(A) of the upper thin film electrode 16 and the upper protective layer 20 is smaller than the length of the piezoelectric layer 12. Therefore, as illustrated in FIG. 5(B), the piezoelectric layer 12 and the upper thin film electrode 16 are laminated to form a stepped portion, and the end portion of the upper thin film electrode 16 is positioned inside the side surface of the piezoelectric layer 12.

Although not illustrated in the figure, it is preferable that the stepped portion between the piezoelectric layer 12 and the upper thin film electrode 16, that is, the exposed portion of the piezoelectric layer 12 is covered with an insulating sheet or the like.

On the side of both edges in left and right directions in FIG. 5(A) of the upper thin film electrode 16 and the upper protective layer 20, grooves M which extend in directions parallel to the respective edges are provided.

In this way, the configuration in which the distance between the upper and lower thin film electrodes is increased by making the sizes of the thin film electrode and the protective layer smaller than the size of the piezoelectric layer and the configuration in which the groove M is provided in a portion of the outer peripheral portion of the transduction film may be combined.

In the present invention, an insulating filling portion which fills the groove M may be further provided.

Figure 6:
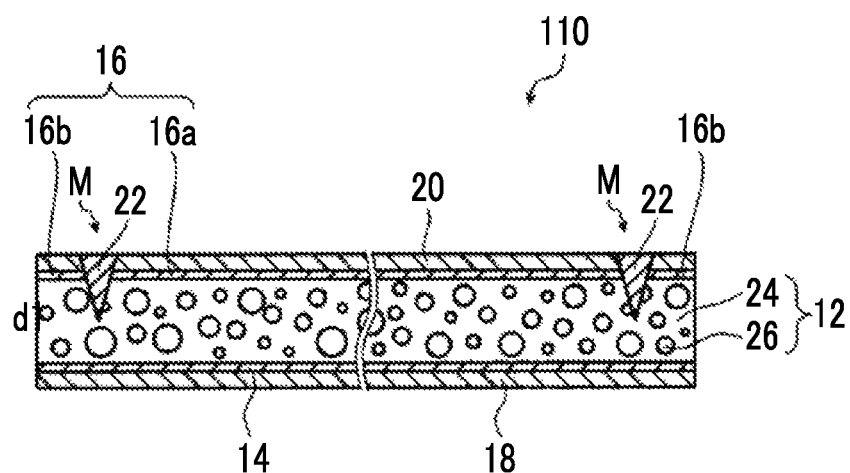
FIG. 6 is a schematic sectional view illustrating another example of the electroacoustic transduction film of the present invention.

FIG. 6 illustrates a schematic sectional view of another example of the electroacoustic transduction film of the present invention.

Since a transduction film 110 illustrated in FIG. 6 has the same structure as the transduction film 10 illustrated in FIG. 1(A) except that the filling portion 22 is provided in the groove M, like parts are denoted by reference numerals, and different parts are mainly described in the following description.

In the transduction film 110 illustrated in FIG. 6, the V-shaped groove M is formed on the side of the upper thin film electrode 16 and the upper protective layer 20, and the groove M is filled with the filling portion 22.

The filling portion 22 is made of an insulating material and prevents the upper thin film electrode 16a on the inside and the floating electrode 16b from being electrically connected to each other.

Since the filling portion 22 is provided, it is possible to suppress a reduction in the strength of the outer peripheral portion. In addition, the piezoelectric layer 12 is prevented from being exposed and the safety is further enhanced.

In the illustrated example, the filling portion 22 is formed so as to be flush with the surface of the upper protective layer 20, but the filling portion 22 is not limited thereto. The filling portion 22 may fill a portion of the groove M or may be formed to protrude convexly from the surface of the protective layer. In addition, it is preferable that the filling portion 22 is filled to be formed up to at least the position of the thin film electrode.

The material of the filling portion 22 may ensure the insulating properties of the groove M, that is, the insulation between the thin film electrode on the inside and the floating electrode, and a material having a suitable dielectric constant may be appropriately selected according to the width of the groove M, the thickness of the piezoelectric layer, and the like.

Specifically, polyethylene (PE), polyethyl terephthalate (PET), polytetrafluoroethylene (PTFE), polypropylene (PP), polystyrene (PS), polycarbonate (PC), polyphenylene sulfite (PPS), polymethyl methacrylate (PMMA), polyetherimide (PEI), polyimide (PI), polyethylene naphthalate (PEN), triacetylcellulose (TAC), polyamide (PA, aramid), and the like may be used.

Next, a manufacturing method of the electroacoustic transduction film of the present invention will be described.

The manufacturing method of the electroacoustic transduction film of the present invention is a manufacturing method including:

a preparation step of preparing a laminated body having a piezoelectric layer which stretches and contracts in response to the state of an electric field, an upper thin film electrode formed on one principal surface of the piezoelectric layer, a lower thin film electrode formed on the other principal surface of the piezoelectric layer, an upper protective layer formed on the upper thin film electrode, and a lower protective layer formed on the lower thin film electrode; and a groove forming step of forming a groove which penetrates the thin film electrode and the protective layer in at least a portion of the outer peripheral portion in a surface direction of at least one of the upper thin film electrode and the upper protective layer, or the lower thin film electrode and the lower protective layer, in the laminated body.

In addition, as a preferable embodiment, the manufacturing method of the electroacoustic transduction film of the present invention includes a heating step of performing an aging treatment by heating the piezoelectric layer after the groove forming step.

First, an example of the preparation step in the manufacturing method of the electroacoustic transduction film of the present invention (hereinafter, also referred to as the manufacturing method of the present invention) will be described with reference to FIGS. 7(A) to 7(E).

Figure 7A:
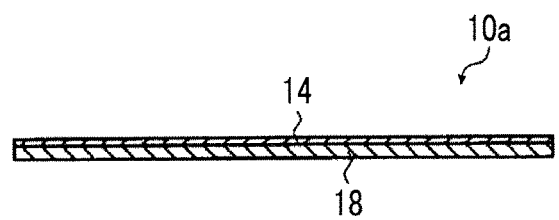
FIGS. 7(A) to 7(E) are conceptual views illustrating an example of a manufacturing method of an electroacoustic transduction film of the present invention.

First, as illustrated in FIG. 7(A), a sheet-like material 10a is prepared in which the lower thin film electrode 14 on the lower protective layer 18 is formed.

The sheet-like material 10a may be prepared by forming a copper thin film or the like as the lower thin film electrode 14 on the surface of the lower protective layer 18 using vacuum vapor deposition, sputtering, plating, and the like.

When the lower protective layer 18 is extremely thin, and thus the handling ability is degraded, the lower protective layer 18 with a separator (temporary supporter) may be used. As the separator, a PET film having a thickness of approximately 25 to 100 μm, and the like are able to be used. The separator may be removed after thermal compression bonding of the thin film electrode and the protective layer.

Alternatively, a commercially available product in which the copper thin film or the like is formed on the lower protective layer 18 may be used as the sheet-like material 10a.

On the other hand, a coating material is prepared by dissolving a polymer material as the material of a matrix such as cyanoethylated PVA in an organic solvent, and adding the piezoelectric body particles 26 such as PZT particles, and stirring and dispersing the resultant.

The organic solvent is not particularly limited, and as the organic solvent, various organic solvents are able to be used.

Figure 7B:
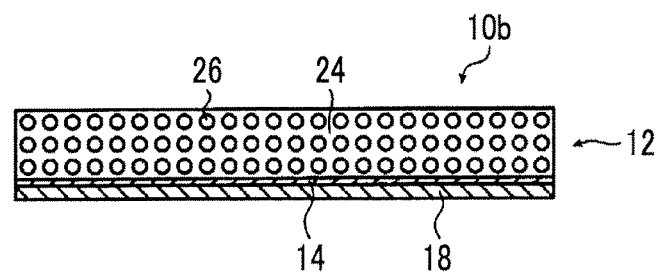

When the sheet-like material 10a described above is prepared and the coating material is prepared, the coating material is cast (applied) onto the surface of the sheet-like material 10a, and the organic solvent is evaporated and dried. Accordingly, as illustrated in FIG. 7(B), a laminated body 10b in which the lower thin film electrode 14 is provided on the lower protective layer 18 and the piezoelectric layer 12 is formed on the lower thin film electrode 14 is prepared.

A casting method of the coating material is not particularly limited, and as the casting method, all known methods (coating devices) such as a slide coater or a doctor knife are able to be used.

In addition, as described above, in the transduction film 10 of the present invention, in addition to the viscoelastic material such as cyanoethylated PVA, a polymer piezoelectric material such as PVDF may be added to the matrix 24.

When the polymer piezoelectric material is added to the matrix 24, the polymer piezoelectric material added to the coating material may be dissolved.

When the laminated body 10b in which the lower thin film electrode 14 is provided on the lower protective layer 18 and the piezoelectric layer 12 is formed on the lower thin film electrode 14 is prepared, it is preferable that the piezoelectric layer 12 is subjected to polarization processing (poling).

A polarization processing method of the piezoelectric layer 12 is not particularly limited, and as the polarization processing method, a known method is able to be used. As a preferred polarization processing method, a method illustrated in FIGS. 7(C) and 7(D) is exemplified.

Figure 7C:
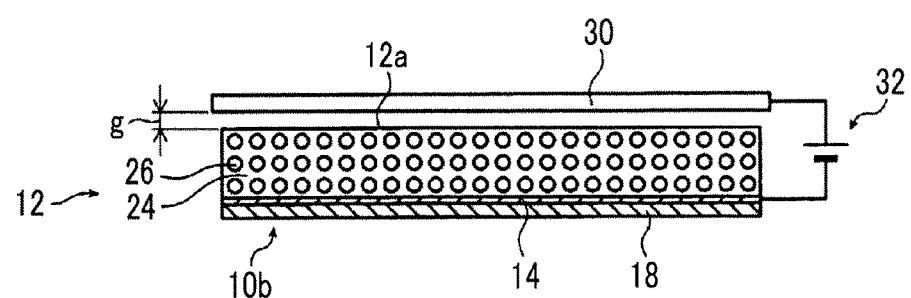
Figure 7D:
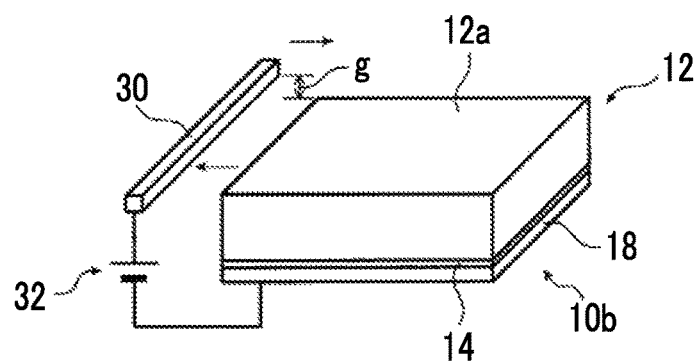
Figure 7E:
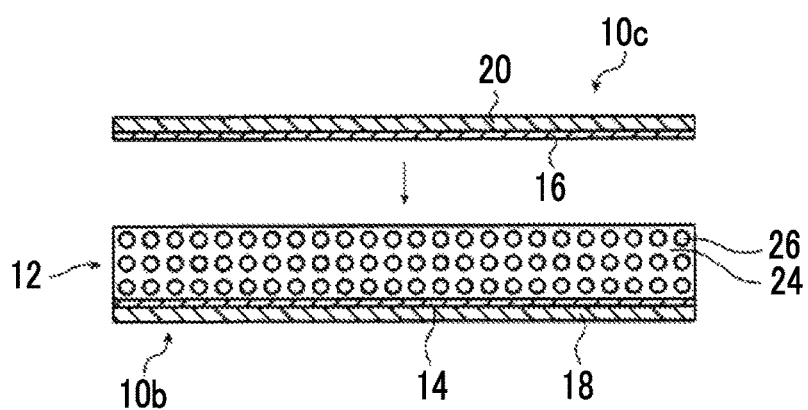

In this method, as illustrated in FIGS. 7(C) and 7(D), for example, a gap g of 1 mm is opened on an upper surface 12a of the piezoelectric layer 12 of the laminated body 10b, and a rod-like or wire-like corona electrode 30 which is able to be moved along the upper surface 12a is disposed. Then, the corona electrode 30 and the lower thin film electrode 14 are connected to a direct-current power source 32.

Furthermore, heating means for heating and holding the laminated body 10b, for example, a hot plate is prepared.

Then, in a state where the piezoelectric layer 12 is heated and held by the heating means, for example, at a temperature of 100° C., a direct-current voltage of a few kV, for example, 6 kV, is applied between the lower thin film electrode 14 and the corona electrode 30 from the direct-current power source 32, and thus a corona discharge occurs. Furthermore, in a state where the gap g is maintained, the corona electrode 30 is moved (scanned) along the upper surface 12a of the piezoelectric layer 12, and the piezoelectric layer 12 is subjected to the polarization processing.

During the polarization processing using the corona discharge (hereinafter, for convenience, also referred to as corona poling processing) known rod-like moving means may be used to move the corona electrode 30.

In addition, in the corona poling processing, a method of moving the corona electrode 30 is not limited. That is, the corona electrode 30 is fixed, a moving mechanism for moving the laminated body 10b is provided, and the polarization processing may be performed by moving the laminated body 10b. Moving means for a known sheet-like material may be used to move the laminated body 10b.

Furthermore, the number of corona electrodes 30 is not limited to one, and the corona poling processing may be performed by using a plurality of lines of corona electrodes 30.

In addition, the polarization processing is not limited to the corona poling processing, and normal electric field poling in which a direct-current electric field is directly applied to an object to be subjected to the polarization processing may also be used. However, in a case where this normal electric field poling is performed, it is necessary that the upper thin film electrode 16 is formed before the polarization processing.

Before the polarization processing, calendar processing may be performed to smoothen the surface of the piezoelectric layer 12 using a heating roller or the like. By performing the calendar processing, a thermal compression bonding process described below is able to be smoothly performed.

In this way, while the piezoelectric layer 12 of the laminated body 10b is subjected to the polarization processing, a sheet-like material 10c is prepared in which the upper thin film electrode 16 is formed on the upper protective layer 20. This sheet-like material 10c may be prepared by forming a copper thin film or the like on the surface of the upper protective layer 20 as the upper thin film electrode 16 using vacuum vapor deposition, sputtering, plating, and the like.

Next, as illustrated in FIG. 7(F), the sheet-like material 10c is laminated on the laminated body 10b in which the piezoelectric layer 12 is subjected to the polarization processing while the upper thin film electrode 16 faces the piezoelectric layer 12.

Figure 8A:
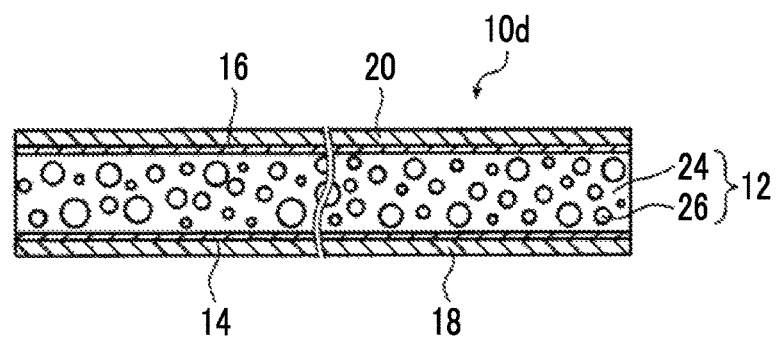
FIGS. 8(A) to 8(C) are conceptual views illustrating an example of the manufacturing method of the electroacoustic transduction film of the present invention.

Furthermore, a laminated body of the laminated body 10b and the sheet-like material 10c is interposed between the upper protective layer 20 and the lower protective layer 18, and is subjected to the thermal compression bonding using a heating press device, a heating roller pair, or the like such that a laminated body 10d as illustrated in FIG. 8(A) is prepared. This laminated body 10d is the laminated body prepared in the preparation step.

Next, the groove forming step will be described with reference to FIGS. 8(A) and 8(B).

In the laminated body 10d prepared in the preparation step as illustrated in FIG. 8(A), the groove M which penetrates the thin film electrode and the protective layer is formed at a predetermined position of at least a portion of the outer peripheral portion in the surface direction of at least one of the upper thin film electrode 16 and the upper protective layer 20, or the lower thin film electrode 14 and the lower protective layer 18. Accordingly, the transduction film 10 of the present invention as illustrated in FIG. 8(B) is prepared.

A forming method of the groove M in the groove forming step is not particularly limited. For example, a method of forming the groove M by removing portions of the protective layers and the thin film electrodes through machining with a cutting tool such as a cutter, an end mill, a diamond cutting tool, a Thomson cutter, or the like or through laser processing (laser ablation) with a carbon dioxide laser, an excimer laser, a semiconductor laser, or the like is able to be used.

For example, the groove M may be formed at a desired position of the protective layer and the thin film electrode by scanning the formation position of the groove M in the protective layer with a laser beam. At this time, it is possible to form the groove portion M having a desired depth and a width by controlling the intensity of the laser beam, the scanning speed (that is, the processing time by the laser beam), and the like.

In addition, in the case of forming the groove M through machining, it is possible to form the groove M having a desired depth and a width by controlling the shape and size of the cutting tool, processing strength, and the like.

Next, the heating step will be described with reference to FIGS. 8(B) to 8(C).

The heating step is a step included as a preferable embodiment in the manufacturing method of the present invention.

In the heating step, after the groove forming step, the piezoelectric layer is heated to cause the matrix 24 of the piezoelectric layer to flow, thereby making the thickness of the piezoelectric layer of the groove M uniform. In the present invention, causing the matrix 24 of the piezoelectric layer to flow so as to make the thickness uniform is called an aging treatment.

Figure 8B:
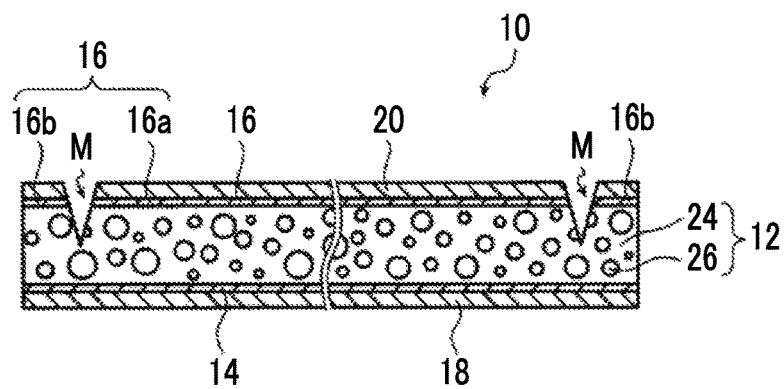
Figure 8C:
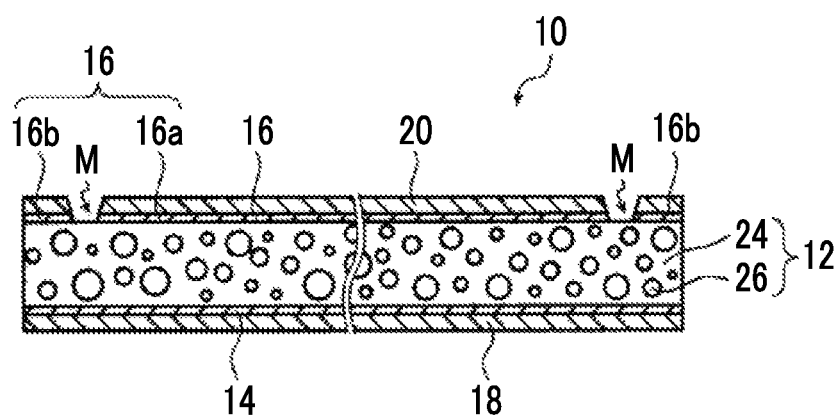

As illustrated in FIG. 8(B), when the groove M is formed in the groove forming, step, depending on the forming method of the groove M, a portion of the piezoelectric layer 12 is removed and the groove M enters a state of being formed down to the portion of the piezoelectric layer 12.

Regarding this, after the groove forming step, the heating step is performed and the aging treatment of the piezoelectric layer is performed, whereby the matrix 24 flows to the part removed in the groove forming step and the piezoelectric layer 12 in the groove M can be repaired. Therefore, as illustrated in FIG. 8(C), the thickness of the piezoelectric layer 12 in the groove M can be made equal to that of the other portions, or at least greater than the thickness after the groove forming step.

Accordingly, it is possible to prevent a decrease in the strength of the outer peripheral portion.

The heating method in the heating step is not particularly limited, and various known heating methods such as hot plate heating, electric furnace heating, infrared heating, and microwave heating are able to be appropriately used.

The heating temperature is also not particularly limited and may be appropriately set according to the material of the piezoelectric layer 12, the heat resistance of the protective layer or the thin film electrode, the width and depth of the groove M formed in the groove forming step, and the like. The heating temperature is preferably 30° C. to 160° C., and preferably 50° C. to 140° C.

Next, an electroacoustic transducer using the transduction film of the present invention will be described.

Figure 9A:
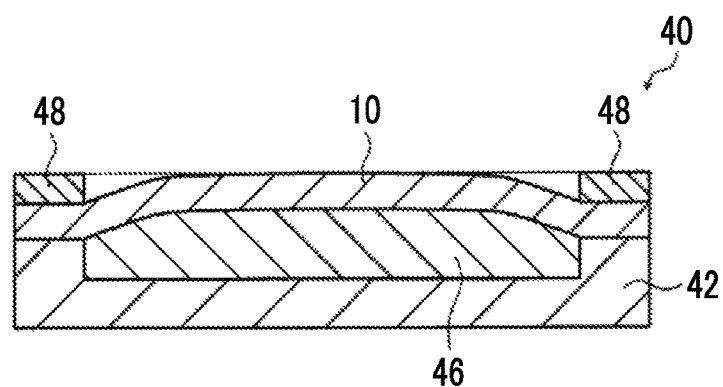
FIGS. 9(A) to 9(C) are conceptual views illustrating an example of a piezoelectric speaker n which the electroacoustic transduction film of the present invention is used.
Figure 9B:
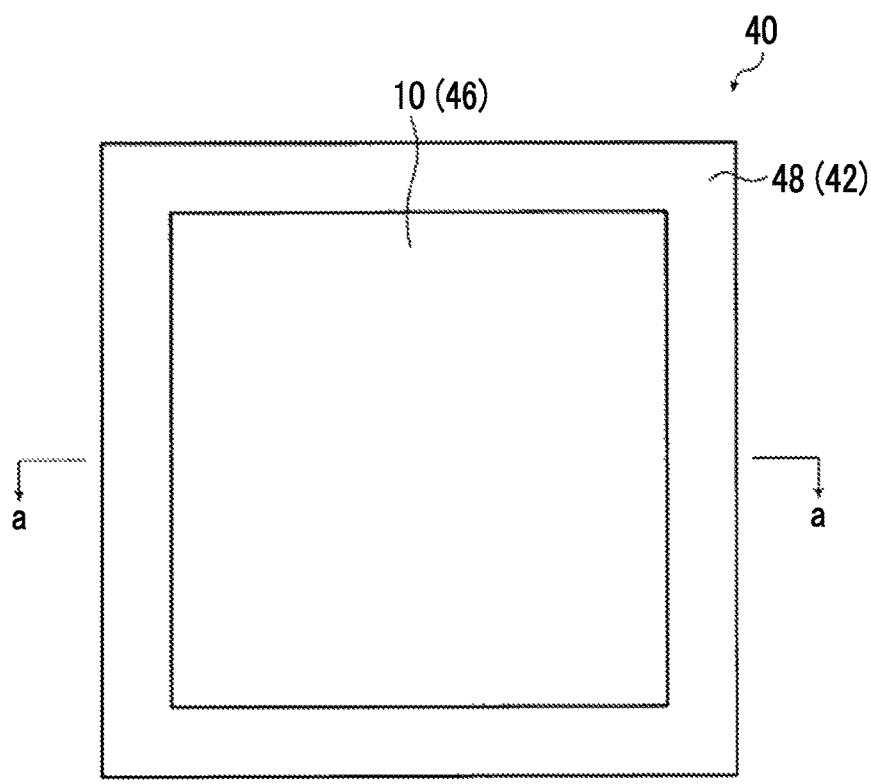

FIG. 9(B) is a plan view illustrating an example of the electroacoustic transducer using the transduction film of the present invention, and FIG. 9(A) is a sectional view taken along line a-a in FIG. 9(B).

An electroacoustic transducer 40 illustrated in FIGS. 9(A) and 9(B) is a flat type piezoelectric speaker in which the transduction film 10 of the present invention described above is used as a speaker diaphragm for converting an electrical signal into vibration energy.

The piezoelectric speaker 40 is able to be used as a microphone or a sensor.

The piezoelectric speaker 40 in the illustrated example basically includes the transduction film 10 (piezoelectric film), a case 42, a viscoelastic supporter 46, and a frame 48.

The case 42 is a thin housing formed of plastic or the like in a square tubular shape in which one side is open. In the piezoelectric speaker using the transduction film of the present invention, the case 42 (that is, the piezoelectric speaker) is not limited to the square tubular shape, and a housing having various shapes such as a cylindrical shape and a rectangular tubular shape having a rectangular bottom surface is able to be used.

In addition, the frame 48 is a plate material which has an opening at the center and has a shape similar to the upper end surface (open side) of the case 42.

Furthermore, the viscoelastic supporter 46 has moderate viscosity and elasticity, supports the transduction film 10, and applies a constant mechanical bias to any place of the transduction film so as to convert the stretching and contracting movement of the transduction film 10 into a forward and rearward movement (a movement in a direction perpendicular to the surface of a film). As an example, wool felt, nonwoven fabric of wool felt including rayon or PET, a foamed material (foamed plastic) such as glass wool or polyurethane, a laminate of a plurality of sheets of paper, a coating material, and the like are exemplified.

In the illustrated example, the viscoelastic supporter 46 has a quadrangular prism shape having a slightly larger bottom surface shape than the bottom surface of the case 42.

The specific gravity of the viscoelastic supporter 46 is not particularly limited and may be appropriately selected according to the type of the viscoelastic supporter. As an example, in a case where felt is used as the viscoelastic supporter, the specific gravity thereof is preferably 50 to 500 kg/m$^3$, and more preferably 100 to 300 kg/m$^3$. In a case where glass wool is used as the viscoelastic supporter, the specific gravity thereof is preferably 10 to 100 kg/m$^3$.

The piezoelectric speaker 40 is configured by accommodating the viscoelastic supporter 46 in the case 42, covering the case 42 and the viscoelastic supporter 46 with the transduction film 10, and in a state in which the periphery of the transduction film 10 is pressed against the upper end surface of the case 42 by the frame 48, fixing the frame 48 to the case 42.

A method of fixing the frame to the case 42 is not particularly limited, and various known methods such as a method using a screw and a bolt nut and a method using a fixing jig are able to be used.

Figure 9C:
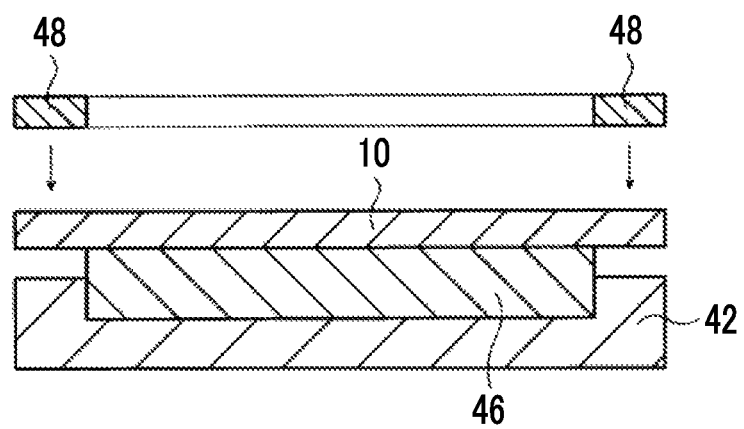

Here, in the piezoelectric speaker 40, the viscoelastic supporter 46 has a quadrangular prism shape in which the height (thickness) is greater than the height of the inner surface of the case 42. That is, as schematically illustrated in FIG. 9(C), in a state before the transduction film 10 and the frame 48 are fixed, the viscoelastic supporter 46 is in a state protruding from the upper surface of the case 42.

Therefore, in the piezoelectric speaker 40, the viscoelastic supporter 46 is held in a state in which the viscoelastic supporter 46 is pressed downward by the transduction film 10 and decreases in thickness toward the peripheral portion of the viscoelastic supporter 46. That is, the principal surface of the transduction film 10 is held in a curved state.

At this time, it is preferable that the entire surface of the viscoelastic supporter 46 is pressed in the surface direction of the transduction film 10 so that the thickness decreases over the entire surface. That is, it is preferable that the entire surface of the transduction film 10 is pressed and supported by the viscoelastic supporter 46.

In the piezoelectric speaker 40 using the transduction film 10 of the present invention, the pressing force of the transduction film 10 exerted on the viscoelastic supporter 46 is not particularly limited, and is preferably about 0.02 to 0.2 MPa in terms of surface pressure at a position where the surface pressure is low.

In the illustrated example, regarding the height difference of the transduction film 10 assembled into the piezoelectric speaker 40, the distance between the point nearest to the bottom surface of the frame 48 and the point furthest from the bottom surface is not particularly limited, and is preferably 1 to 50 mm, and particularly preferably about 5 to 20 mm from viewpoints of obtaining a thin flat speaker and enabling the transduction film 10 to sufficiently perform an upward and downward movement.

In addition, although the thickness of the viscoelastic supporter 46 is not particularly limited, the thickness thereof before pressing is particularly 1 to 100 mm, and particularly preferably 10 to 50 mm.

In the piezoelectric speaker 40, when the transduction film 10 is stretched in the in-plane direction due to the application of a voltage to the piezoelectric layer 12, the transduction film 10 moves upward (in the radial direction of sound) in order to absorb the stretching.

Conversely, when the transduction film 10 is contracted in the in-plane direction due to the application of a voltage to the piezoelectric layer 12, the transduction film 10 moves downward (toward the case 42) in order to absorb the contraction.

The piezoelectric speaker 40 generates a sound by vibrations caused by repetition of stretching and contraction of the transduction film 10.

In the piezoelectric speaker 40, the viscoelastic supporter 46 is in a state of being more compressed in the thickness direction as it approaches the frame 48. However, due to the static viscoelastic effect (stress relaxation), a constant mechanical bias can be maintained at any place of the transduction film 10. Accordingly, the stretching and contracting movement of the transduction film 10 is efficiently converted into a forward and rearward movement, so that it is possible to obtain a flat piezoelectric speaker 40 that is thin, achieves a sufficient sound volume, and has excellent acoustic properties.

Here, in the piezoelectric speaker 40 in the illustrated example, the entire peripheral area of the transduction film 10 is pressed against the case 42 (that is, the viscoelastic supporter 46) by the frame 48, but the present invention is not limited thereto.

That is, the electroacoustic transducer using the transduction film 10 of the present invention is also able to use a configuration in which the transduction film 10 is pressed against and fixed to the surface of the case 42 by screws, bolt nuts, jigs, or the like, for example, at the four corners of the case 42 without using the frame 48.

An O-ring or the like may be interposed between the case 42 and the transduction film 10. With this configuration, a damper effect is able to be achieved, and it is possible to prevent the vibration of the transduction film 10 from being transmitted to the case 42, and to obtain more excellent acoustic properties.

In addition, the electroacoustic transducer using the transduction film 10 may be configured to include a support plate on which the viscoelastic supporter 46 is placed instead of the case 42 that accommodates the viscoelastic supporter 46.

That is, a configuration in which the viscoelastic supporter 46 is placed on the support plate having rigidity, the transduction film 10 is placed to cover the viscoelastic supporter 46, the same frame 48 as described above is placed on the peripheral portion of the transduction film 10, and the frame 48 is fixed to the support plate by screws or the like to press the viscoelastic supporter 46 against the transduction film 10 together with the frame 48 and bend the transduction film 10 is also able to be used.

Furthermore, even in this configuration that does not have the case 42, the transduction film 10 may be held in a state where the viscoelastic supporter 46 is pressed and thinned by screws or the like without using the frame 48.

A configuration in which the vibration of the transduction film 10 is further amplified by using various diaphragms made of polystyrene, foamed PET, or carbon fiber as the material of the support plate may be adopted.

Moreover, the electroacoustic transducer using the transduction film 10 is not limited to the configuration that presses the periphery, and for example, a configuration in which points other than the periphery of the laminated body of the viscoelastic supporter 46 and the transduction film 10 are pressed by some means and at least a portion of the transduction film 10 is held in a curved state is also able to be used.

Alternatively, a configuration in which a resin film is attached to the transduction film 10 to apply (hold) a tension thereto may also be adopted. By configuring the transduction film 10 to be held with the resin film and causing the transduction film 10 to be held in a curved state, a flexible speaker is able to be obtained.

Alternatively, the transduction film 10 may be configured to be stretched over a curved frame.

In addition, the electroacoustic transducer using the transduction film of the present invention is not limited to the configuration using the viscoelastic supporter 46.

For example, a configuration in which an airtight material having the same shape as that of the case 42 is used as a case, the open end of the case is covered and closed by the transduction film 10, gas is introduced into the case to apply a pressure to the transduction film 10, and the transduction film 10 is thus held in a convexly swollen state.

In the configuration in which a pressure is applied to the inside, the distortion component increases due to the influence of the air spring, and there is concern that the acoustic quality may deteriorate. On the other hand, in the case of the configuration in which the transduction film 10 is supported by a viscoelastic supporter such as glass wool or felt, since viscosity is imparted, the distortion component does not increase, which is preferable.

In addition, those other than the gas may fill the case, and a magnetic fluid or a coating material is able to be used as long as an appropriate viscosity is able to be imparted.

Furthermore, the combination using the viscoelastic supporter and the configuration in which a pressure is applied to the inside may be combined.

The electroacoustic transduction film of the present invention is able to be suitably used as a speaker by being assembled with a flexible display such as an organic EL display. Furthermore, since the electroacoustic transduction film of the present invention is thin, the electroacoustic transduction film is able to be suitably assembled with a thin display device such as a liquid crystal display device, an electronic paper, and a screen for a projector.

With such a configuration, it is possible to improve the design properties and entertainment properties of the transduction film. Further, by integrating the transduction film as a speaker with a screen or a display, it is possible to reproduce a sound in a direction in which an image is displayed, and to improve a sense of realism.

In addition, the screen for a projector is flexible and is thus able to be provided with curvature. By causing an image display surface to be provided with curvature, it is possible to make the distance from an observer to the screen substantially uniform between the center and the end portion of the screen, and it is possible to improve a sense of realism.

In the case where the image display surface is provided with curvature as described above, distortion occurs in the projected image. Therefore, it is preferable to perform image processing on the data of the projected image so as to reduce the distortion according to the curvature of the image display surface.

Furthermore, as described above, in the transduction film 10 of the present invention, the piezoelectric layer 12 also has a capability of converting vibration energy into an electrical signal.

Therefore, by using this, the transduction film 10 of the present invention is able to be suitably used also in a microphone or a sensor (pickup) for a musical instrument. For example, since the transduction film 10 of the present invention has flexibility, the transduction film 10 is able to be attached to a throat portion of a person having a complex curved surface, and acts as a vocal cord microphone merely by being attached to the vicinity of the vocal cord.

As described above, the electroacoustic transduction film of the present invention and the manufacturing method thereof are described in detail, but the present invention is not limited to the examples described above, and various improvements or modifications may be performed within a range not deviating from the gist of the present invention.

EXAMPLES

Hereinafter, the present invention will be described in more detail with reference to specific examples of the present invention.

Example 1

According to the method illustrated in FIGS. 7(A) to 7(E) and FIGS. 8(A) to 8(B) described above, the transduction film 10 of the present invention illustrated in FIG. 1(A) and FIG. 1(B) was prepared.

First, cyanoethylated PVA (CR-V manufactured by Shin-Etsu Chemical Co., Ltd.) was dissolved in dimethylformamide (DMF) at the following compositional ratio. Thereafter, PZT particles were added to this solution at the following compositional ratio, and were dispersed by using a propeller mixer (rotation speed 2000 rpm), and thus a coating material for forming the piezoelectric layer 12 was prepared.

| | |
|---|---|
| PZT Particles | 300 parts by mass |
| Cyanoethylated PVA | 30 parts by mass |
| DMF | 70 parts by mass |

In addition, the PZT particles were obtained by sintering commercially available PZT raw material powder at 1000 to 1200° C. and thereafter crushing and classifying the resultant so as to have an average particle diameter of 5 µm.

On the other hand, the sheet-like materials 10a and 10c were prepared in which a copper thin film having a thickness of 0.1 µm was vacuum vapor deposited on a PET film having a thickness of 4 µm. That is, in this example, the lower thin film electrode 14 and the upper thin film electrode 16 are copper vapor deposition thin films having a thickness of 0.1 µm, and the lower protective layer 18 and the upper protective layer 20 are PET films having a thickness of 4 µm.

In order to obtain good handling ability during the process, as the PET film, a film with a separator (temporary supporter PET) having a thickness of 50 µm attached thereto was used, and the separator of each lower thin film electrode was removed after thermal compression bonding of the thin film electrode and the protective layer.

The coating material for forming the piezoelectric layer 12 prepared as described above was applied onto the lower thin film electrode 14 of the sheet-like material 10a (the copper vapor deposition thin film) by using a slide coater. Furthermore, the coating material was applied such that the film thickness d1 of the coating film after being dried was 40 µm.

Next, a material in which the coating material was applied onto the sheet-like material 10a was heated and dried on a hot plate at 120° C. such that DMF was evaporated. Accordingly, the laminated body 10b was prepared in which the lower thin film electrode 14 made of copper was formed on the lower protective layer 18 made of PET, and the piezoelectric layer 12 (piezoelectric layer) having a thickness d1 of 40 µm was formed thereon.

The piezoelectric layer 12 of the laminated body 10b was subjected to the polarization processing by corona poling illustrated in FIGS. 7(C) and 7(D). Furthermore, the polarization processing was performed by setting the temperature of the piezoelectric layer 12 to 100° C., applying a direct-current voltage of 6 kV between the lower thin film electrode 14 and the corona electrode 30 so as to cause corona discharge to occur.

The sheet-like material 10c was laminated on the laminated body 10b which was subjected to the polarization processing while the upper thin film electrode 16 (copper thin film side) faced the piezoelectric layer 12.

Next, the laminated body of the laminated body 10b and the sheet-like material 10c was subjected to the thermal compression bonding at 120° C. by using a laminator device, and thus the piezoelectric layer 12 was adhered to the lower thin film electrode 14 and the upper thin film electrode 16 such that the laminated body 10d was prepared.

Next, the groove M was formed on the side of the upper thin film electrode 16 and the upper protective layer 20 of the prepared laminated body 10d so as to be continuous along the entire periphery of the outer peripheral portion such that the transduction film 10 was prepared.

As a forming method of the groove M, cutting by a cutter was performed using Cutting Plotter FC4200-60 manufactured by GRAPHTEC Corporation.

The width d2 of the groove M was set to 20 µm, the distance d3 from the edge to the groove M was set to 5 mm, and the depth d4 of the groove M in the piezoelectric layer 12 was set to 5 µm.

Thereafter, the electrode lead-out portion 34 was formed in the lower thin film electrode 14 and the upper thin film electrode 16a on the inside, and the wire 36 was connected thereto.

The electrode lead-out portion 34 was formed by removing a portion of the protective layer to form a thin layer portion, inserting a silver paste as a conductive material into the thin layer portion, breaking the protective layer by pressing the resultant, and electrically connecting the conductive material to the thin film electrode.

Examples 2 to 25

The transduction film 10 was prepared in the same manner as in Example 1 except that the thickness d1 of the piezoelectric layer 12 and the width d2 of the groove M were changed to the conditions shown in Table 1 below. Regarding Examples 21 to 25, the distance D3 from the edge to the groove M was set to 5 mm and the depth d4 of the groove M in the piezoelectric layer 12 was set to 3 µm.

Comparative Examples 1 to 5

The transduction film 10 was prepared in the same manner as in Example 1 except that the thickness d1 of the piezoelectric layer was changed to the conditions shown in Table 1 below and the groove M was not formed.

Examples 26 and 27

A transduction film was prepared in the same manner as in Example 2 except that the configuration in which the filling portion 22 filling the groove M was provided was adopted.

In addition, polyethylene was used as the material of the filling portion 22, and the filling portion 22 was formed by filling the groove M with polyethylene and heating the resultant in an oven for 30 minutes so as to cause the sample surface temperature to reach 110° C.

Example 28

The transduction film 10 was produced in the same manner as in Example 2 except that PVDF not containing piezoelectric body particles was used as the piezoelectric layer.

A piezoelectric layer was formed in the same manner as in Example 1 except that a coating material containing PVDF and MEK at the following composition ratio was prepared as the coating material of the PVDF piezoelectric layer.

| | |
|---|---|
| PVDF | 100 parts by mass |
| MEK | 300 parts by mass |

Comparative Example 6

The transduction film 10 was prepared in the same manner as in Example 14 except that the groove M was not formed.

[Evaluation]
[Operation Check]

It was evaluated whether or not a sound was generated by the prepared transduction film.

First, a circular test piece of ϕ150 mm was prepared from the prepared transduction film. The test piece was fixed so as to cover the opening surface of a plastic round case having an inner diameter of 138 mm and a depth of 9 mm, and the pressure inside the case was maintained at 1.02 atm. Accordingly, the transduction film was bent into a convex shape like a contact lens so as to be used in a piezoelectric speaker.

Ten of such piezoelectric speakers were prepared, and a sinusoidal alternating voltage at 1 kHz and an effective voltage of 5.0 V was applied to each piezoelectric speaker to evaluate whether or not a sound was generated.

A case where the number of piezoelectric speakers that generated a sound was 9 or more was evaluated as A, and a case where the number of piezoelectric speakers that generated a sound was 8 or less was evaluated as B.

It is considered that, in the transduction films which did not generate a sound, the burrs F present at the edge portions of the thin film electrodes had bitten into the piezoelectric layer 12 and the upper and lower thin film electrodes were electrically connected to each other.

[Dielectric Breakdown Voltage]

The dielectric breakdown voltage of the transduction film was measured using the piezoelectric speaker which was confirmed to generate a sound by the operation check described above.

An alternating voltage was applied to the upper thin film electrode 16 and the lower thin film electrode 14 of the transduction film assembled into the piezoelectric speaker, and the voltage (peak-peak value) at the time when no sound was generated was measured as the dielectric breakdown voltage. The frequency was 1 kHz.

The evaluation results are shown in Table 1.

TABLE 1

| | Piezoelectric layer Thickness d1 μm | Groove M Width d2 μm | Evaluation Operation check | Dielectric breakdown voltage V |
|---|---|---|---|---|
| Example 1 | 40 | 20 | A | 210 |
| Example 2 | 40 | 40 | A | 280 |
| Example 3 | 40 | 80 | A | 420 |
| Example 4 | 40 | 100 | A | 490 |
| Example 5 | 40 | 200 | A | 500 or higher |
| Comparative Example 1 | 40 | — | B | 140 |
| Example 6 | 20 | 10 | A | 105 |
| Example 7 | 20 | 20 | A | 140 |
| Example 8 | 20 | 40 | A | 210 |
| Example 9 | 20 | 100 | A | 420 |
| Example 10 | 20 | 200 | A | 500 or higher |
| Comparative Example 2 | 20 | — | B | 70 |
| Example 11 | 10 | 5 | A | 52 |
| Example 12 | 10 | 10 | A | 70 |
| Example 13 | 10 | 20 | A | 105 |
| Example 14 | 10 | 40 | A | 175 |
| Example 15 | 10 | 100 | A | 385 |
| Example 16 | 10 | 200 | A | 500 or higher |
| Comparative Example 3 | 10 | — | B | 35 |
| Example 17 | 60 | 30 | A | 315 |
| Example 18 | 60 | 60 | A | 420 |
| Example 19 | 60 | 120 | A | 500 or higher |
| Example 20 | 60 | 200 | A | 500 or higher |
| Comparative Example 4 | 60 | — | B | 210 |
| Example 21 | 6 | 3 | A | 31 |
| Example 22 | 6 | 12 | A | 63 |
| Example 23 | 6 | 40 | A | 160 |
| Example 24 | 6 | 100 | A | 370 |
| Example 25 | 6 | 200 | A | 500 or higher |
| Comparative Example 5 | 6 | — | B | 21 |
| Example 26 | 40 | 40 | A | 280 |
| Example 27 | 40 | 100 | A | 490 |
| Example 28 | 40 | 40 | A | 280 |
| Comparative Example 6 | 40 | — | B | 140 |

From Table 1, it can be seen that in Examples 1 to 28 which are the transduction films of the present invention, in which the groove penetrating the thin film electrode and the protective layer was formed in at least a portion of the outer peripheral portion in the surface direction of at least one of the upper thin film electrode and the upper protective layer, or the lower thin film electrode and the lower protective layer, the dielectric breakdown voltage was higher than in Comparative Examples 1 to 6. That is, it could be seen that even when a high voltage is applied, conversion between a vibration and a voltage is able to be appropriately performed without the occurrence of dielectric breakdown of the air between the upper and lower thin film electrodes.

In Comparative Examples 1 to 6, it could be seen in the operation check that there was a case where no sound was generated. It is considered that this is because the burrs present at the edge portions of the thin film electrodes had bitten into the piezoelectric layer and the upper and lower thin film electrodes were electrically connected to each other. In contrast, all of Examples 1 to 28 had operated reliably. This is because even when burrs are present at the edge portions of the thin film electrodes, since the groove M is formed, it is possible to prevent the upper and lower thin film electrodes from being electrically connected to each other.

It could be seen from comparison between Example 1 and Examples 2 to 5, comparison between Example 6 and Examples 7 to 10, comparison between Example 11 and Examples 12 to 16, comparison between Example 17 and Examples 18 to 20, and comparison between Example 21 and Examples 22 to 25 that the width d2 of the groove M is preferably greater than or equal to the thickness d1 of the piezoelectric layer 12, more preferably greater than to equal to twice the thickness d1, and particularly preferably greater than or equal to 100 μm.

From Example 28 and Comparative Example 6, it could be seen that the present invention is also effective in a case where the piezoelectric layer 12 is made of PVDF.

From the above results, the effect of the present invention is obvious.

EXPLANATION OF REFERENCES 10, 100, 110: electroacoustic transduction film
12: piezoelectric layer
14: lower thin film electrode
16: upper thin film electrode
16a: upper thin film electrode on the inside
16b: lower thin film electrode on the outside (floating electrode)
18: lower protective layer
20: upper protective layer
24: matrix
26: piezoelectric body particles
30: corona electrode
32: direct-current power source
34: electrode lead-out portion
36: wire
40: piezoelectric speaker
42: case
46: viscoelastic supporter
48: frame
M: groove

What is claimed is:

1. An electroacoustic transduction film, comprising:
   a piezoelectric layer which stretches and contracts in response to a state of an electric field;
   an upper thin film electrode formed on one principal surface of the piezoelectric layer;

a lower thin film electrode formed on the other principal surface of the piezoelectric layer;

an upper protective layer formed on the upper thin film electrode; and a lower protective layer formed on the lower thin film electrode, wherein a groove which penetrates the thin film electrode and the protective layer is formed in at least a portion of an outer peripheral portion in a surface direction of at least one of the upper thin film electrode and the upper protective layer, or the lower thin film electrode and the lower protective layer, wherein the thin film electrode and the protective layer are divided by the groove into a thin film electrode and a protective layer on the inside of the groove, and a thin film electrode and a protective layer on the outside of the groove, wherein the thin film electrode on the outside of the groove is a floating electrode which is electrically separated from the thin film electrode on the inside of the groove, and wherein a width $d2$ of the groove is greater than or equal to a thickness $d1$ of the piezoelectric layer.

2. The electroacoustic transduction film according to claim 1, wherein the groove is formed down to a portion of the piezoelectric layer.

3. The electroacoustic transduction film according to claim 1, wherein the groove is formed along an entire periphery of the outer peripheral portion in the surface direction of at least one of the upper thin film electrode and the upper protective layer, or the lower thin film electrode and the lower protective layer.

4. The electroacoustic transduction film according to claim 2, wherein the groove is formed along an entire periphery of the outer peripheral portion in the surface direction of at least one of the upper thin film electrode and the upper protective layer, or the lower thin film electrode and the lower protective layer.

5. The electroacoustic transduction film according to claim 1, wherein a width $d2$ of the groove, a thickness $d1$ of the piezoelectric layer, and a voltage applied between the upper thin film electrode and the lower thin film electrode satisfy $d2 > V/3.5 - d1$.

6. The electroacoustic transduction film according to claim 3, wherein a width $d2$ of the groove, a thickness $d1$ of the piezoelectric layer, and a voltage applied between the upper thin film electrode and the lower thin film electrode satisfy $d2 > V/3.5 - d1$.

7. The electroacoustic transduction film according to claim 4, wherein a width $d2$ of the groove, a thickness $d1$ of the piezoelectric layer, and a voltage $V$ applied between the upper thin film electrode and the lower thin film electrode satisfy $d2 > V/3.5 - d1$.

8. The electroacoustic transduction film according to claim 1, wherein a thickness $d1$ of the piezoelectric layer is 5 to 100 μm.

9. The electroacoustic transduction film according to claim 7, wherein a thickness $d1$ of the piezoelectric layer is 5 to 100 μm.

10. The electroacoustic transduction film according to claim 1, further comprising:

an insulating filling portion which fills the groove.

11. The electroacoustic transduction film according to claim 9, further comprising:

an insulating filling portion which fills the groove.

12. The electroacoustic transduction film according to claim 1, wherein the piezoelectric layer is a polymer composite piezoelectric body in which piezoelectric body particles are dispersed in a viscoelastic matrix formed of a polymer material having viscoelasticity at a normal temperature.

13. The electroacoustic transduction film according to claim 11, wherein the piezoelectric layer is a polymer composite piezoelectric body in which piezoelectric body particles are dispersed in a viscoelastic matrix formed of a polymer material having viscoelasticity at a normal temperature.

14. The electroacoustic transduction film according to claim 12, wherein a local maximum value at which a loss tangent Tan δ at a frequency of 1 Hz becomes greater than or equal to 0.5 due to measurement of a dynamic viscoelasticity of the polymer material is present in a temperature range of 0° C. to 50° C.

15. The electroacoustic transduction film according to claim 13, wherein a local maximum value at which a loss tangent Tan δ at a frequency of 1 Hz becomes greater than or equal to 0.5 due to measurement of a dynamic viscoelasticity of the polymer material is present in a temperature range of 0° C. to 50° C.

16. The electroacoustic transduction film according to claim 12, wherein the polymer material has a cyanoethyl group.

17. The electroacoustic transduction film according to claim 15, wherein the polymer material has a cyanoethyl group.

18. The electroacoustic transduction film according to claim 12, wherein the polymer material is cyanoethylated polyvinyl alcohol.

19. The electroacoustic transduction film according to claim 17, wherein the polymer material is cyanoethylated polyvinyl alcohol.

20. The electroacoustic transduction film according to claim 1, wherein an electrode lead-out portion to which a voltage for driving the electroacoustic transduction film is applied is provided in the thin film electrode on the inside of the groove.

* * * * *